(12) United States Patent
Iwase

(10) Patent No.: US 10,076,025 B2
(45) Date of Patent: Sep. 11, 2018

(54) STRETCHABLE CIRCUIT BOARD AND METHOD FOR MANUFACTURING THE SAME

(71) Applicant: NIPPON MEKTRON, LTD., Tokyo (JP)

(72) Inventor: Masayuki Iwase, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/436,960

(22) Filed: Feb. 20, 2017

(65) Prior Publication Data

US 2017/0245362 A1    Aug. 24, 2017

(30) Foreign Application Priority Data

Feb. 22, 2016  (JP) ................................ 2016-030688
Jan. 25, 2017  (JP) ................................ 2017-011100

(51) Int. Cl.
| | |
|---|---|
| H05K 1/02 | (2006.01) |
| H05K 3/38 | (2006.01) |
| H05K 1/09 | (2006.01) |
| H05K 3/40 | (2006.01) |
| H05K 3/46 | (2006.01) |
| H05K 1/03 | (2006.01) |
| H05K 3/12 | (2006.01) |

(52) U.S. Cl.
CPC ........... *H05K 1/0283* (2013.01); *H05K 1/095* (2013.01); *H05K 3/38* (2013.01); *H05K 3/4038* (2013.01); *H05K 3/4617* (2013.01); *H05K 1/0393* (2013.01); *H05K 3/125* (2013.01); *H05K 3/1216* (2013.01); *H05K 3/1275* (2013.01); *H05K 2201/05* (2013.01); *H05K 2201/09263* (2013.01); *H05K 2201/09854* (2013.01); *H05K 2203/0278* (2013.01); *H05K 2203/0534* (2013.01); *H05K 2203/1126* (2013.01); *H05K 2203/30* (2013.01)

(58) Field of Classification Search
CPC .... H05K 1/0283; H05K 3/38; H05K 2201/05; H05K 2203/30
See application file for complete search history.

(56) References Cited

U.S. PATENT DOCUMENTS

| | | | | |
|---|---|---|---|---|
| 4,435,740 | A * | 3/1984 | Huckabee | H01L 23/4985 174/541 |
| 5,759,417 | A * | 6/1998 | Inaba | H05K 1/118 216/18 |
| 7,487,587 | B2 * | 2/2009 | Vanfleteren | H01L 25/50 29/825 |
| 8,187,795 | B2 * | 5/2012 | Jain | B81C 1/0019 257/E23.117 |

(Continued)

FOREIGN PATENT DOCUMENTS

JP    2014-236103 A    12/2014

*Primary Examiner* — Ishwarbhai B Patel
(74) *Attorney, Agent, or Firm* — Westerman, Hattori, Daniels & Adrian, LLP

(57) ABSTRACT

A stretchable circuit board includes plural stretchable bases, and plural stretchable wiring portions, at least one of which is provided on each of main surfaces, facing each other, of the plural stretchable bases, in which the stretchable wiring portions provided on the main surfaces are electrically continuous with each other through a connecting portion.

8 Claims, 12 Drawing Sheets

(56) References Cited

U.S. PATENT DOCUMENTS

| | | | |
|---|---|---|---|
| 8,883,287 B2* | 11/2014 | Boyce | B29C 59/02 |
| | | | 174/254 |
| 9,040,337 B2* | 5/2015 | Park | H05K 1/0283 |
| | | | 438/108 |
| 2011/0254171 A1* | 10/2011 | Guo | H01L 23/5387 |
| | | | 257/774 |
| 2015/0065840 A1* | 3/2015 | Bailey | A61B 5/6802 |
| | | | 600/384 |
| 2017/0094774 A1* | 3/2017 | Elsherbini | H05K 3/4691 |

* cited by examiner

STRETCHABLE CIRCUIT BOARD AND METHOD FOR MANUFACTURING THE SAME

CROSS-REFERENCE TO RELATED APPLICATIONS

This application claims the benefits of Japanese Patent Applications No. 2016-30688 filed on Feb. 22, 2016 and No. 2017-11100 filed on Jan. 25, 2017 in the Japanese Patent Office, the disclosures of which are herein incorporated in its entirety by reference.

BACKGROUND OF THE INVENTION

The present invention relates to stretchable circuit boards.

In the wearable device market and the medical device market, biological sensors and biological information monitors have received much attention in recent years. For example, the sports industry has been making efforts to quantify body movements of competitors in a highly precise manner in order to improve competitors' physical ability or skills. In such a case, wearable biological sensors that sense movements of a living body are used in some occasions. In addition, the medical industry has been trying to detect vital signs (biological information) such as electrocardiograms, heart rates, blood pressures, and body temperatures for the purpose of treatment of diseases or taking measures against presymptomatic diseases, and in some cases, are using biological information monitors that sense biological information. These biological sensors or biological information monitors are generally attached on garments or equipment, and these garments or equipment are worn to perform sensing or monitoring.

However, as a human body moves, these garments or equipment are slightly misaligned from a body. This causes a problem of misalignment of the biological sensor or the biological information monitor, which are provided on a garment or equipment, from the targeted portion of a living body, resulting in a significant deterioration in sensing accuracy or monitoring accuracy.

The problem described above can be prevented if the biological sensor or the biological information monitor is attached directly onto the human body. Thus, in recent years, studies have been made as to a technique called stretchable electronics having a base or wiring that can stretch in in-plane directions, and proposals have been made of circuit boards that can stretch in association with movement of joints and the like of a human body. In a case where biological sensors or biological information monitors are used for medical purposes or the like, it is desired that at least a portion of the biological sensors that is in contact with a living body or used in the vicinity of the living body should be thrown away after it has been used from the viewpoint of prevention of infectious diseases.

A stretchable circuit board of this type includes a circuit board described in Japanese Patent Application Laid-open No. 2014-236103. This circuit board includes a stretchable base and an electroconductive pattern containing electroconductive microparticles and elastomer, and the entire substrate of this circuit board has stretchability.

SUMMARY OF THE INVENTION

In the case of the biological sensor described above, it is effective to employ multiple channels so that it allows human body signals to be detected in a highly precise manner even if the position of the sensor to a human body is misaligned to some degree, or so that it allows biological body signals to be obtained with an increased area. If the biological sensor employs multiple channels, substrate areas that form the biological sensor are restricted. This makes it difficult to employ a so-called one-side structure in which body electrodes and draw-out wirings leading to the outside are placed on the same surface. Thus, it is desirable to form a multi-layer structure in which body electrodes and draw-out wirings are placed on different layers.

However, in Japanese Patent Application Laid-open No. 2014-236103 described above, no discussion is made as to multilayering of the stretchable circuit board.

The present invention has been made in view of the problems as described above, and provides a stretchable circuit board that can achieve multilayering while preventing a wire from breaking in association with stretching, and a method for manufacturing the same.

According to the present invention, there is provided a stretchable circuit board including:

plural stretchable bases;

plural stretchable wiring portions, at least one of which is provided on each of main surfaces, facing each other, of the plural stretchable bases, in which the stretchable wiring portions provided on the respective main surfaces are electrically continuous with each other through a connecting portion.

In addition, according to the present invention, there is provided a method for manufacturing a stretchable circuit board, including:

a step of forming a stretchable wiring portion on a main surface of at least one side of each of plural stretchable bases; and a step of heating or applying pressure to the plural stretchable bases to cause the stretchable wiring portions to be electrically continuous with each other.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE EMBODIMENTS

Figure 1:
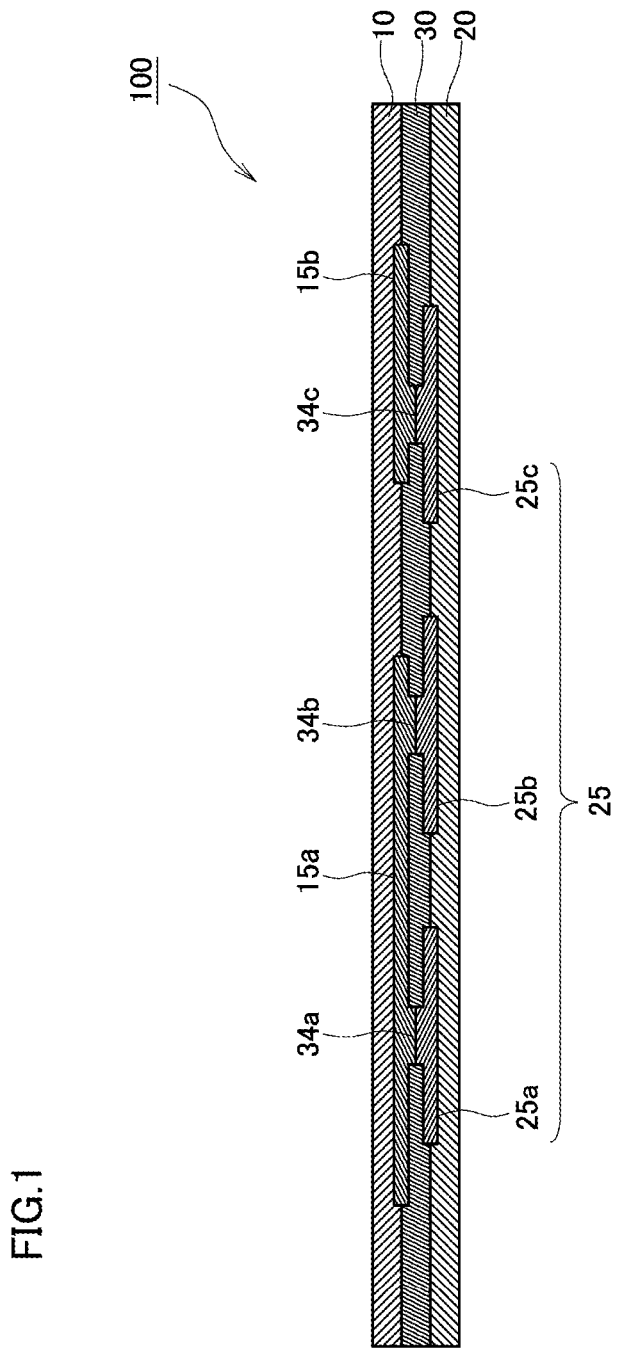
FIG. 1 is a sectional schematic view illustrating a stretchable circuit board 100 according to a first exemplary embodiment.

Hereinbelow, an exemplary embodiment according to the present invention will be described with reference to the drawings. Note that, in each of the drawings, each corresponding constituent component is denoted as the same reference character, and detailed explanation thereof will not be repeated as appropriate.

It should be noted that the "surface" as used in this specification does not necessarily means being geometrically completely flat, and is allowed to have a recessed portion or a protruding portion formed thereon. Furthermore, in this specification, the terms "sheet," "film," and "film-shaped thing" have broad meanings, and include a thing that generally has a thin thickness, and difference in name does not represents the thickness size of the thing.

First Exemplary Embodiment

Hereinbelow, a first exemplary embodiment according to the present invention will be described with reference to FIG. 1 and FIG. 2.

Figure 2:
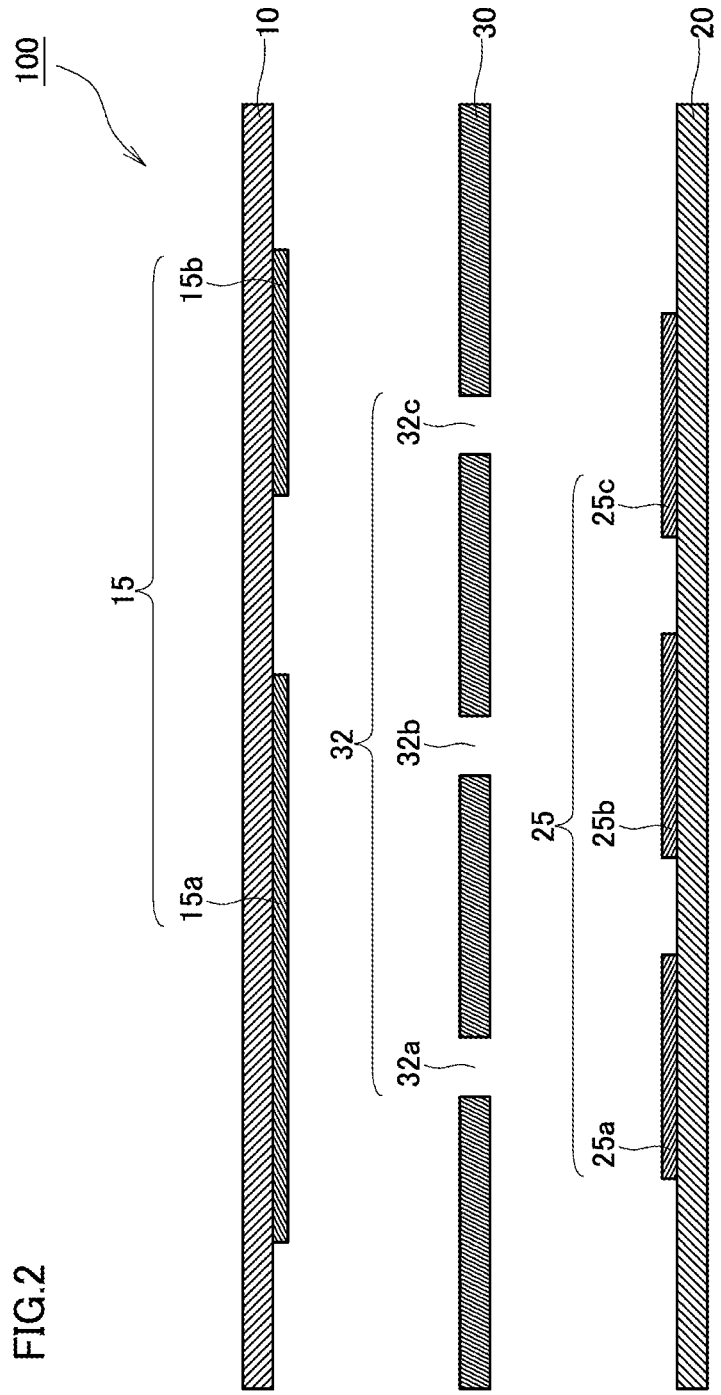
FIG. 2 is an exploded schematic view illustrating the stretchable circuit board 100 according to the first exemplary embodiment.

FIG. 1 is a sectional schematic view illustrating a stretchable circuit board 100 according to the first exemplary embodiment. FIG. 2 is an exploded schematic view illustrating the stretchable circuit board 100 according to the first exemplary embodiment. For the purpose of convenience, the upper side in FIG. 1 and FIG. 2 may be called the upper surface side, and the bottom side may be called the lower surface side. These directions, however, are defined for the purpose of convenience with the aim of illustrating relative positional relationships of constituent elements, and do not necessarily match the top or bottom in the gravity direction.

The stretchable circuit board 100 includes plural stretchable bases 10 and 20, and an interlayer stretchable base 30, and has a multi-layer structure with these bases being layered therein. Below, the stretchable bases 10 and 20, and the interlayer stretchable base 30 may be simply called bases 10, 20, and 30, respectively.

The stretchable bases 10 and 20, and the interlayer stretchable base 30 are sheet-shaped member that can stretch in at least one direction of in-plane directions. It is desirable that the bases 10, 20, and 30 can stretch in two directions of in-plane directions. The bases 10, 20, and 30 may have isotropic stretchability in in-plane directions, or may have anisotropic stretchability in in-plane directions so that they stretch differently in different directions in plane.

Each of the bases 10, 20, and 30 is made from an electrically insulating material. A preferable base material of the bases 10, 20, and 30 includes an elastomer material such as nitrile rubber, latex rubber, urethane-based elastomer, and silicone-based elastomer. However, the base material is not limited to these materials. In particular, by employing a urethane-based elastomer sheet as used in medical applications, it is possible to enhance safety in the case where it is attached on the skin of a human body.

The bases 10, 20, and 30 may be made from the same material, or may be made from different materials. In addition, the interlayer stretchable base 30 may be made from a material that is different from those of the stretchable bases 10 and 20. In the case where all of the bases 10, 20, and 30 are made from a base material having a fusing property, it is possible to firmly join these bases through heating and application of pressure to the bases 10, 20, and 30 without using any adhesive or pressure-sensitive adhesive.

Although there is no limitation as to the thickness of the bases 10, 20, and 30, it is preferable to set the thickness of these bases, for example, to not more than 100 μm from the viewpoint of not blocking stretching movements of the target (target surface) (for example, the surface of a living body) to which the stretchable circuit board 100 is applied. The thickness of each of the bases is set more preferably to not more than 25 μm, still more preferably to not more than 10 μm. These bases 10, 20, and 30 may have the same thickness, or may have different thicknesses. In addition, the interlayer stretchable base 30 may have a thickness different from those of the stretchable bases 10 and 20.

The interlayer stretchable base 30 lies between main surfaces, facing each other, of the stretchable bases 10 and 20, and is a base having stretchability.

The interlayer stretchable base 30 has at least one opening 32. In the example illustrated in FIG. 2, the interlayer stretchable base 30 has three openings 32a, 32b, and 32c. Note that a stretchable wiring portion may be located in the interlayer stretchable base 30.

It is preferable that the interlayer stretchable base 30 has moisture permeability lower than those of the stretchable bases 10 and 20. The moisture permeability represents an index indicating the degree of moisture that a substance allows to pass through it, and can be expressed as the amount of water (g) that passes through a substance per unit of time (24 hours) in a unit of area (one square meter). In the case where the stretchable circuit board 100 is of a type that is attached on a living body, the moisture permeability of the stretchable base 10, 20 is set to be a relatively higher permeability, for example, to not less than approximately 1000 $(g/m^2 \cdot 24 \ hr)$ in order to reduce the accumulation of evaporating moisture caused, for example, by sweating. At this time, if the interlayer stretchable base 30 has the same degree of moisture permeability as those of the stretchable bases 10 and 20, it is highly likely that ion migration takes place between the layers due to application of a desired voltage to the stretchable circuit board 100. In particular, this possibility of occurrence of ion migration increases if the electrically conductive materials of a stretchable wiring portion 15 and a stretchable wiring portion 25 are made mainly from silver. By setting the moisture permeability of the interlayer stretchable base 30 to be lower than those of the stretchable bases 10 and 20, it is possible to reduce the amount of water passing between layers, reducing the occurrence of ion migration.

Furthermore, the moisture permeability of the interlayer stretchable base 30 also has an effect on the moisture permeability of the entire stretchable circuit board 100. In particular, since the interlayer stretchable base 30 according to this exemplary embodiment is provided so as to be joined with substantially the entire area of each of the stretchable bases 10 and 20, the effect of the moisture permeability of the interlayer stretchable base 30 is significant. Thus, it is desirable to decide the moisture permeability of the interlayer stretchable base 30 by comprehensively evaluating the required range of the moisture permeability of the entire stretchable circuit board 100, an achievable range of moisture permeability of each of the bases 10, 20, and 30, and the possibility of occurrence of ion migration.

For example, in the case where the moisture permeability of the stretchable bases 10 and 20 is set to approximately 1000 (g/m$^2$·24 hr), it is preferable to set the moisture permeability of the interlayer stretchable base 30 to not more than 500 (g/m$^2$·24 hr). This value is a value measured under conditions of 40 degrees and 90% RH of Testing Methods for Determination of the Water Vapour Transmission Rate (Dish Method) specified in JIS Z 0208. As described above, it is preferable to set the moisture permeability of the interlayer stretchable base 30 to not more than half of the moisture permeability of the stretchable base 10, 20. With this setting, the moisture permeability of each of the stretchable bases 10 and 20 is increased to enable the entire stretchable circuit board 100 to prevent the accumulation of evaporating moisture caused, for example, by sweating, and at the same time, the reduced moisture permeability of the interlayer stretchable base 30 can prevent the occurrence of ion migration.

The interlayer stretchable base 30 may be provided so as to be joined with a partial area of each of the stretchable bases 10 and 20. For example, the interlayer stretchable base 30 may be provided so as to lie in a limited area that contains an area where stretchable wiring portions, which are to be in an electrically insulating state via a layer, are layered in a layered direction. In this case, the moisture permeability of the interlayer stretchable base 30 may be set lower than that set in the case described above, whereby the moisture permeability of the stretchable circuit board 100 can be kept high in an area where the interlayer stretchable base 30 does not lie.

In addition, the moisture permeability of the interlayer stretchable base 30 may differ according to positions in plane. For example, the interlayer stretchable base 30 may be formed in a manner such that the moisture permeability is lower in the limited area including an area where stretchable wiring portions, which are to be in the electrically insulating state via a layer, are layered in a layered direction, and the moisture permeability in the other area is higher than that in the limited area.

Moreover, the interlayer stretchable base 30 may be provided with plural openings (not illustrated) in an area where no stretchable wiring portion is formed, with the aim of improving a moisture permeability property of the interlayer stretchable base 30. In this case, even if the moisture permeability of the interlayer stretchable base 30 is set to be significantly low, the openings described above facilitate moisture passing through. Hence, the accumulation of evaporating moisture caused, for example, by sweating can be prevented in the entire stretchable circuit board 100, and at the same time, the occurrence of ion migration can be prevented by the reduced moisture permeability of the interlayer stretchable base 30.

At least one of plural stretchable wiring portions 15, 25 is provided on each of main surfaces, facing each other, of the stretchable bases 10, 20. In the example illustrated in the drawing, stretchable wiring portions 15a and 15b are provided on the lower surface of the stretchable base 10, and stretchable wiring portions 25a, 25b, and 25c are provided on the upper surface of the stretchable base 20. A terminal portion 41 and an electrode portion 43, which will be described later with reference to FIG. 3, and the stretchable wiring portions 15 and 25 are stretchable electroconductive patterns that are patterns formed on the respective main surfaces of the stretchable bases 10 and 20. In the exemplary embodiment according to the present invention, two of the plural stretchable wiring portions are referred to as a first stretchable wiring portion and a second stretchable wiring portion, respectively. In addition, at least either one of the first stretchable wiring portion and the second stretchable wiring portion has a line-shaped line portion having a constant width. The first stretchable wiring portion and the second stretchable wiring portion have a pattern portion, and the pattern portion includes a portion of which length in the width direction of the line portion is longer than the line portion. In the first exemplary embodiment, each of the stretchable wiring portions 15 and 25 corresponds to the line portion, and each of the terminal portion 41 and the electrode portion 43 corresponds to the pattern portion.

The stretchable wiring portions 15, 25, the terminal portion 41, and the electrode portion 43 are configured to include an electrically conductive material, and have electrical conductivity. For the electrically conductive material described above, it may be possible to select a material having preferable electrical conductivity such as silver, gold, platinum, carbon, copper, aluminum, cobalt, and nickel, or an alloy thereof. There is no particular limitation as to the shape of the electrically conductive material. However, it may be possible to use a particle-like shape such as a granule and powder. There is no particular limitation as to the shape of the particle. However, it may be possible to use a spherical shape, a needle shape, a flake shape, a nanowire shape, or the like. An aspect ratio of the particle may be set, for example, to be not less than 1 and not more than 100, and in particular, be not less than 1 and not more than 50. Here, the aspect ratio means a ratio of the longest dimension of a three-dimensional body relative to the shortest dimension. By setting the aspect ratio of particles constituting each of the stretchable wiring portions 15 and 25 to not less than 5 and not more than 20, it is possible to reduce a change in resistance in the case where the stretchable circuit board 100 stretches in in-plane directions and the stretchable wiring portions 15 and 25 deform in the longitudinal direction.

It is preferable that the stretchable wiring portions 15 and 25 further include a resin binder. For example, the stretchable wiring portions 15 and 25 are made from an electrically conductive material prepared in a manner such that electrically conductive particles are dispersed in a resin material. Since the stretchable wiring portions 15 and 25 include the resin binder, it is possible to prevent the stretchable wiring portions 15 and 25 from breaking due to stretching of the stretchable circuit board 100. The resin binder includes, for example, a binder containing urethane, polyester or other resin as a primary component, and a thermoplastic elastomer material such as silicone rubber. However, the resin binder is not limited to these. For the resin binder, it is desirable to select a resin binder having reduced Young's modulus so that the stretchable wiring portions 15 and 25 in a state of coating have an elastic modulus less than or equal to those of the stretchable bases 10 and 20. It may be possible to use one type of elastomer material, or may be possible to mix plural types of elastomer material, and use it.

Although there is no particular limitation as to a method for forming the stretchable wiring portions 15 and 25, it may be possible to form them, for example, through a printing method. In other words, the stretchable wiring portions 15 and 25 are printed patterns that are formed by printing and applying an electroconductive paste having stretchability onto the stretchable base 10 or 20. Although there is no particular limitation as to the printing method, examples of the printing method include a screen printing method, an inkjet printing method, a gravure printing method, and an offset printing method. Of these methods, screen printing is preferably used from the viewpoint of obtaining fine resolution as well as stably printing a thick coating. In the case where the stretchable wiring portions 15 and 25 are formed through the printing method, it is preferable to formulate an electroconductive paste containing the electrically conductive particles, the resin binder, and organic solvent, and use the formulated one in the printing method. By using a stretchable electroconductive paste containing metal particles such as silver as the primary component to form the stretchable wiring portions 15 and 25, it is possible to form a circuit exhibiting an excellent stretching property with an elongation percentage, for example, of approximately not less than 50% and not more than 70%.

The stretchability of each of the stretchable wiring portions 15 and 25 may be achieved by the above-described material of the stretchable wiring portions 15 and 25 themselves, or may be achieved by a structure such as a meandering shape, or may be achieved by the combination thereof. For example, by forming the stretchable wiring portions 15 and 25 on the stretchable bases 10 and 20 in a meandering shape in plan view, the stretchable wiring portions 15 and 25 can follow stretching of the stretchable bases 10 and 20.

The thickness size and the width size of each of the stretchable wiring portions 15 and 25 can be determined on the basis of resistivity of each of the stretchable wiring portions 15 and 25 at no load, a change in resistance of each of the stretchable bases 10 and 20 when each of the stretchable bases 10 and 20 stretches, and restriction on the thickness size and the width size of the entire stretchable circuit board 100. The width size of each of the stretchable wiring portions 15 and 25, which serve as the line portion, is set preferably to not more than 1000 μm, more preferably to not more than 500 μm, still more preferably to not more than 200 μm, so that the stretchable wiring portions 15 and 25 can follow a change in sizes of the stretchable bases 10 and 20 at the time of stretching, thereby achieving favorable stretchability. The thickness size of each wire constituting the stretchable wiring portions 15 and 25 may be set to not more than 25 μm, and be set desirably to be not less than 10 μm and not more than 15 μm.

According to the present exemplary embodiment, the stretchable wiring portions 15 and 25 are electrically continuous with each other through a connecting portion 34 in the opening 32 of the interlayer stretchable base 30. In the example illustrated, a stretchable wiring portion 15a and a stretchable wiring portion 25a are electrically continuous with each other through a connecting portion 34a in an opening 32a; the stretchable wiring portion 15a and a stretchable wiring portion 25b are electrically continuous with each other through a connecting portion 34b in an opening 32b; and a stretchable wiring portion 15b and a stretchable wiring portion 25c are electrically continuous with each other through a connecting portion 34c in an opening 32c.

The connecting portion 34 is a constituent element that electrically connects stretchable wiring portions each disposed on different layers of stretchable bases, and are realized in various forms. In this specification, the connecting portion 34 is described as an independent constituent element for the purpose of explanation. However, the connecting portion 34 may be a part of the stretchable wiring portion 15 or 25.

It is preferable to form the connecting portion 34 by integrally fusing part of the stretchable wiring portion 15 and part of the stretchable wiring portion 25. In this case, the stretchable wiring portions 15 and 25 are formed on the stretchable bases 10 and 20 through printing and application of an electroconductive paste containing a thermoplastic resin binder, and the stretchable bases 10 and 20 are subjected to heat pressing with the interlayer stretchable base 30 being disposed between the stretchable bases 10 and 20, whereby the connecting portion 34 is formed. More specifically, through application of heat pressing, part of each of the stretchable wiring portions 15 and 25 enters the opening 32, and resin binders of individual wiring portions 15 and 25 are integrally fused at a joining portion thereof due to the fusing property of these wiring portions 15 and 25. However, depending of manufacturing methods, it may be possible to employ a configuration in which part of either of the stretchable wiring portions 15 and 25 enters the opening 32, and is fused with the other stretchable wiring portion. This formation enables the connecting portion 34 to have a stretching property equal to those of the stretchable wiring portions 15 and 25, whereby the connecting portion 34 can follow stretching of the surrounding stretchable bases 10 and 20. In addition, in the vicinity of the connecting portion 34, the stretchable bases 10 and 20 are each firmly joined with the interlayer stretchable base 30 with the thermal fusing property that these bases have. This prevents stress from concentrating on the connecting portion 34, thereby preventing wires from breaking at the connecting portion 34 and its surroundings. Alternatively, either of the stretchable wiring portions 15 and 25 may be made from an electroconductive paste containing a thermosetting resin binder. In this case, the stretchable wiring portions 15 and 25 are joined at the connecting portion 34 with the fusing property of the other stretchable wiring portion.

As for the other mode, the connecting portion 34 may be formed, for example, using through-hole plating, or an electrically conductive filling. The through-hole plating can be formed, for example, by forming a metal film on an area of a part of each main surface on both sides of the interlayer stretchable base 30, making a hole (opening 32) in the area, and forming a metal layer on the wall surface of the opening 32 through electroless plating. In this case, the connecting portion 34 includes a metal layer of the wall surface of the opening 32. On the other hand, in the case of a filling method, pressure or heat is applied to the stretchable bases 10 and 20 in a state where the opening 32 of the interlayer stretchable base 30 is filled with an electroconductive paste, whereby the stretchable wiring portion 15 and the stretchable wiring portion 25 are made electrically continuous with each other. In this case, the connecting portion 34 corresponds to an electrically conductive member formed by solidifying the electroconductive paste with which the opening 32 is filled. Moreover, the connecting portion 34 may be formed through a method called $B^2$ it (Buried Bump Interconnection Technology). In this case, an electrically conductive raised portion is formed at a position located on the stretchable wiring portion 25 and overlaying with the stretchable wiring portion 15, and the interlayer stretchable base 30 is physically pierced through by this raised portion, whereby the stretchable wiring portion 15 and the stretchable wiring portion 25 are made electrically continuous with each other. In this case, the through hole corresponds to the opening 32, and the electrically conductive raised portion corresponds to the connecting portion 34. As described above, any method may be used to form the connecting portion 34.

In the stretchable circuit board 100 according to the first exemplary embodiment, the stretchable bases 10 and 20 and the interlayer stretchable base 30 are layered. In addition, the stretchable wiring portion 15 and the stretchable wiring portion 25, each provided on each main surface and facing each other, of the stretchable bass 10 and 20, are electrically continuous with each other through the connecting portion 34 in the opening 32 of the interlayer stretchable base 30. In other words, the stretchable wiring portion 15 and the stretchable wiring portion 25 formed on the stretchable base 10 and the stretchable base 20 are electrically isolated via a layer by the interlayer stretchable base 30, and at the same time, are electrically connected by the connecting portion 34 in the opening 32. As described above, according to this exemplary embodiment, it is possible to establish desired electrical connection of stretchable wiring portions between layers while preventing short circuit of the stretchable wiring portions via a layer, and hence, it is possible to form complicated and high-density wiring. In addition, all of the stretchable bases 10 and 20, the stretchable wiring portions 15 and 25, and the interlayer stretchable base 30 have stretchability, and hence, in the case where stretching behavior is applied to the stretchable circuit board 100, it is possible to reduce a possibility of a disconnection of a wiring portion occurring in association with stretching.

[Manufacturing Method]

Next, a method (hereinafter, also referred to as the present method) for manufacturing the stretchable circuit board 100 according to the first exemplary embodiment will be described with reference to FIG. 2.

The method for manufacturing the stretchable circuit board 100 at least includes: a step (wiring forming step) of forming the stretchable wiring portion 15 or 25 on a main surface of at least one side of each of the plural stretchable bases 10 and 20; a step (placing step) of placing the stretchable bases 10 and 20 and the interlayer stretchable base 30 at positions where the formed stretchable wiring portions 15 and 25 face each other with the opening 32 of the interlayer stretchable base 30 being disposed between the stretchable wiring portions 15 and 25; and a step (electrical connection step) of heating or applying pressure to the stretchable bases 10 and 20 to cause the stretchable wiring portions 15 and 25 to be electrically continuous with each other through the connecting portion 34 in the opening 32 of the interlayer stretchable base 30. The order of these steps being performed before or after may be freely determined.

Here, "cause the stretchable wiring portions 15 and 25 to be electrically continuous with each other through the connecting portion 34 in the opening 32" at least includes a case where the stretchable wiring portions 15 and 25 are joined with each other to cause them to be electrically continuous with each other while forming the connecting portion 34, and a case where the connecting portion 34 is formed in advance, and then, the stretchable wiring portions 15 and 25 are each joined with the connecting portion 34 to cause them to be electrically continuous with each other.

Next, the present method will be described in detail.

In the wiring forming step, the stretchable bases 10 and 20 are prepared, and an electroconductive paste is applied to each main surface of these bases through a printing method to form the stretchable wiring portion 15 or 25. In this exemplary embodiment, an electroconductive paste is applied onto the lower surface of the stretchable base 10 to form stretchable wiring portions 15a and 15b, and an electroconductive paste is applied onto the upper surface of the stretchable base 20 to form stretchable wiring portions 25a, 25b, and 25c. In order to enhance handleability of the stretchable bases 10 and 20 having stretchability, the wiring forming step described above may be performed in a state where the upper surface of the stretchable base 10 and the lower surface of the stretchable base 20 are coated with a separator (not illustrated) made out of, for example, paper or a film material.

In the placing step, the main surface (lower surface) of the stretchable base 10 having the stretchable wiring portions 15a and 15b formed thereon is caused to face the main surface (upper surface) of the stretchable base 20 having the stretchable wiring portions 25a, 25b, and 25c formed thereon. The interlayer stretchable base 30 is caused to lie between the bases 10 and 20. In this state, the stretchable bases 10 and 20 and the interlayer stretchable base 30 are positioned. At this time, this positioning is performed in a manner such that the stretchable wiring portion 15a faces the stretchable wiring portions 25a and 25b with the openings 32a and 32b, and the stretchable wiring portion 15b faces the stretchable wiring portion 25c with the opening 32c.

The electrical connection step varies depending on methods for forming the connecting portion 34. In the case where the connecting portion 34 is formed by integrally fusing part of the stretchable wiring portion 15 with part of the stretchable wiring portion 25, the electrical connection step is performed in the following manner.

Heat or pressure is applied to the stretchable bases 10 and 20 to directly join opposing surfaces of the stretchable base 10 and the interlayer stretchable base 30 and directly join opposing surfaces of the stretchable base 20 and the interlayer stretchable base 30, whereby part of the stretchable wiring portion 15 and part of the stretchable wiring portion 25 are integrally fused with each other. More specifically, part of the stretchable wiring portion 15a and part of the stretchable wiring portion 25a are caused to be integrally fused with each other in the opening 32a; part of the stretchable wiring portion 15a and part of the stretchable wiring portion 25b are caused to be integrally fused with each other in the opening 32b; and part of the stretchable wiring portion 15b and part of the stretchable wiring portion 25c are caused to be integrally fused with each other in the opening 32c. At this time, heat or pressure is applied in a state where the electroconductive paste applied to each of the stretchable bases 10 and 20 is dry, and hence, it is possible to prevent occurrence of short circuit except for the opening 32 of the interlayer stretchable base 30.

In addition, at this time, with the fusing property of each of the bases activated by application of heat or pressure, the stretchable base 10 and the interlayer stretchable base 30 are fused with each other, and the stretchable base 20 and the interlayer stretchable base 30 are fused with each other. The method of heating includes a laminate method using a heating roll, and a method using heating and pressing. Pressing may be performed under the atmosphere, or may be performed in a vacuum. With these configurations, it is possible to firmly join the stretchable bases 10 and 20 with the interlayer stretchable base 30 without using any adhesive or pressure-sensitive adhesive, and at the same time, it is possible to electrically connect the stretchable wiring portion 15 with the stretchable wiring portion 25. As a result, connection operation completes in a significantly simplified manner.

In this electrical connection step, it may be possible to separately perform the step of heating or applying pressure to the interlayer stretchable base 30 and either one of the stretchable bases 10 and 20 to join them and the step of applying heat or applying pressure to the remaining one of the stretchable bases 10 and 20 to join the layered body formed through this joining step with the remaining one of the stretchable bases 10 and 20.

In the case where the connecting portion 34 is formed through through-hole plating, it may be possible to apply plating processing to the opening 32 of the interlayer stretchable base 30, and then, perform the electrical connection step described above. In the case where the connecting portion 34 is formed through filling, it may be possible to perform the electrical connection step described above in a state where the opening 32 of the interlayer stretchable base 30 is filled with an electroconductive paste or this electroconductive paste is solidified. Alternatively, it may be possible that either one of the stretchable bases 10 and 20 is joined with the interlayer stretchable base 30, the opening 32 is filled with an electroconductive paste, and then, heat or pressure is applied to the remaining one of the stretchable bases 10 and 20 to join the remaining one with the layered body.

In the case of the stretchable circuit board according to the first exemplary embodiment described above, the stretchable wiring portions formed on main surfaces of respective plural stretchable bases are exposed to each other through opening portions. With this configuration, respective stretchable wiring portions formed on different stretchable bases are electrically isolated in terms of a form of layer by the interlayer stretchable base, and at the same time, are electrically connected through a layer by the connecting portion in the opening. In addition, all of the stretchable bases, the stretchable wiring portions, and the interlayer stretchable base have stretchability. Thus, according to the present invention, even if stretching behavior is applied to the stretchable circuit board, it is possible to reduce a possibility of a disconnection occurring in association with the stretching, and also possible to form high-density wiring with the multi-layer structure. Furthermore, with the stretchable circuit board according to the first exemplary embodiment, the interlayer stretchable base 30 is provided between the stretchable bases 10 and 20, and hence, it is possible to deal with relatively complicated routing of the stretchable wiring portion 15 or the stretchable wiring portion 25. Thus, it is possible to increase the freedom of design of wiring.

In addition, with the method for manufacturing the stretchable board according to the first exemplary embodiment, it is possible to obtain the stretchable circuit board described above.

Second Exemplary Embodiment

Below, a stretchable circuit board 100 according to a second exemplary embodiment will be described with reference to FIG. 3 to FIG. 5. This description will be made with focus being placed on details specific to the second exemplary embodiment, and details that are the same as those in the first exemplary embodiment will not be repeated as appropriate.

Figure 3:
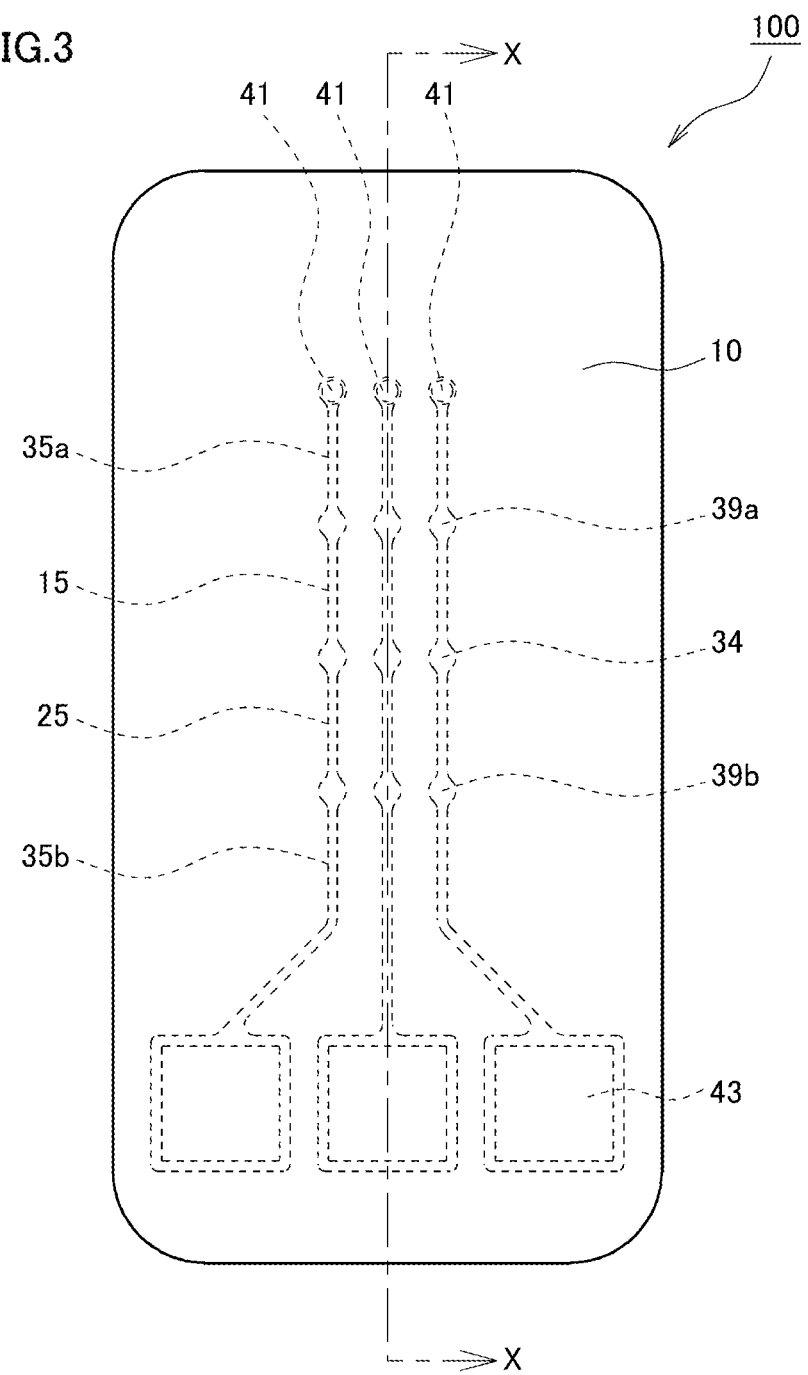
FIG. 3 is a plan view illustrating a stretchable circuit board according to a second exemplary embodiment when viewed from the upper surface side (from the upper side in FIG. 4)
Figure 4:
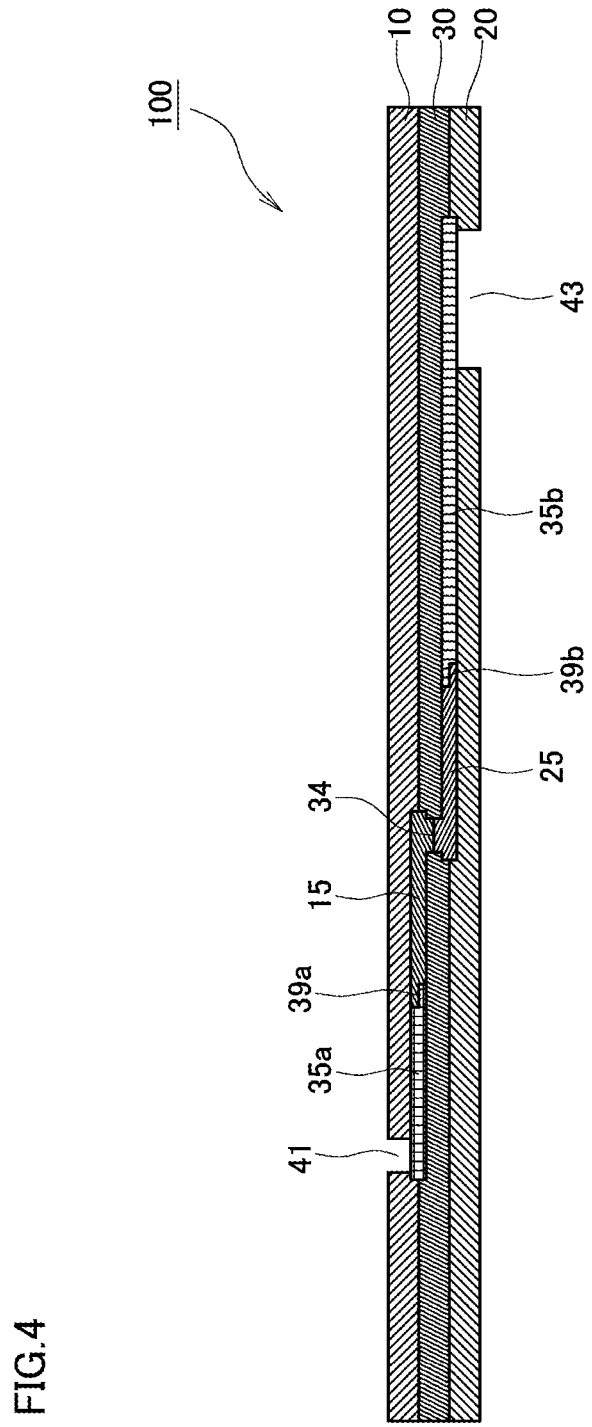
FIG. 4 is a sectional view taken along the line X-X in FIG. 3.
Figure 5:
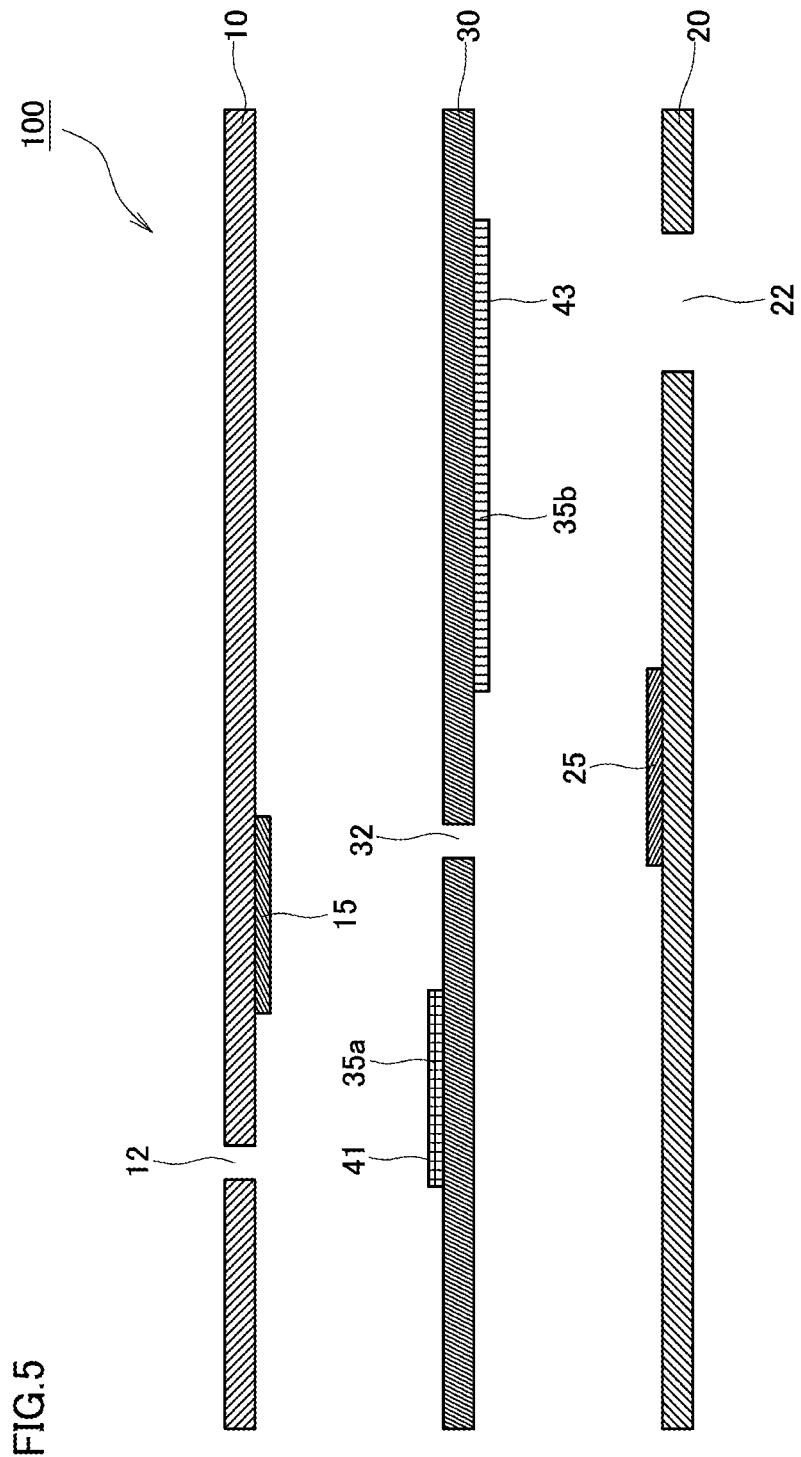
FIG. 5 is an exploded schematic view of FIG. 4.

FIG. 3 is a plan view illustrating the stretchable circuit board 100 according to the second exemplary embodiment when viewed from the upper surface side (from the upper side in FIG. 4). FIG. 4 is a sectional view taken along the line X-X in FIG. 3. FIG. 5 is an exploded schematic view of FIG. 4. For the purpose of convenience, the side away from a reader who is looking at FIG. 3 and the bottom side in FIG. 4 and FIG. 5 may be called the lower surface side, and the side toward the reader who is looking at FIG. 3 and the upper side in FIG. 4 and FIG. 5 may be called the upper surface side. These directions, however, are defined for the purpose of convenience with the aim of illustrating relative positional relationships of constituent elements, and do not necessarily match the top or bottom in the gravity direction.

The stretchable circuit board 100 according to the second exemplary embodiment can be used as a stretchable circuit board that is attached to a living body. In the case of this usage form, the stretchable circuit board 100 flexibly follows movements of the body surface of a living body due to its stretchability. However, the way in which the stretchable circuit board 100 is used is not limited to such a usage form, that is, being attached to a living body. For example, the stretchable circuit board 100 may also be used by attaching it to a robot, various types of devices, units, or wearable items.

As in the first exemplary embodiment, the stretchable circuit board 100 has a multi-layer structure in which a stretchable base 10, a stretchable base 20, and an interlayer stretchable base 30 are layered. The stretchable base 10 has the lower surface having a stretchable wiring portion 15 provided thereon, and the stretchable base 20 has the upper surface having a stretchable wiring portion 25 provided thereon. In addition, the stretchable wiring portion 15 and the stretchable wiring portion 25 are integrally fused with each other at the opening 32 of the interlayer stretchable base 30, and are electrically continuous with each other.

On the other hand, unlike the first exemplary embodiment described above, according to the second exemplary embodiment, interlayer stretchable wiring portions 35a and 35b are provided on respective main surfaces of both sides of the interlayer stretchable base 30. In addition, part of the interlayer stretchable wiring portion 35a is connected with part of the stretchable wiring portion 15 of the stretchable base 10 in the thickness direction (connecting portion 39a), and part of the interlayer stretchable wiring portion 35b is connected with part of the stretchable wiring portion 25 of the stretchable base 20 in the thickness direction (connecting portion 39b). These connections allow the stretchable wiring portion 15 and the interlayer stretchable wiring portion 35a to be electrically continuous with each other, and also allow the stretchable wiring portion 25 and the interlayer stretchable wiring portion 35b to be electrically continuous with each other. Note that, as in the first exemplary embodiment, the stretchable wiring portion 15 and the stretchable wiring portion 25 are electrically continuous with each other through the connecting portion 34 in the opening 32.

More specifically, the stretchable circuit board 100 according to the second exemplary embodiment further includes an interlayer stretchable wiring portion provided on one main surface of the interlayer stretchable base 30 in addition to the configuration of the first exemplary embodiment. A main surface, having a stretchable wiring portion provided thereon, of one of the plural stretchable bases 10 and 20 directly or indirectly faces and is layered with the main surface of the interlayer stretchable base 30. Parts of the stretchable wiring portion and the interlayer stretchable wiring portion are connected with each other in the thickness direction, allowing them to be electrically continuous with each other.

The interlayer stretchable wiring portions 35a and 35b are electroconductive patterns having stretchability as with the stretchable wiring portions 15 and 25. The material, the method of formation, the shape, the thickness, and the like of the interlayer stretchable wiring portions 35a and 35b are set in a similar manner to those of the stretchable wiring portions 15 and 25.

In addition, it is preferable that connecting portions 39a and 39b are formed in a manner such that an end portion of the stretchable wiring portion 15 and an end portion of the interlayer stretchable wiring portion 35a are integrally fused with each other, and an end portion of the stretchable wiring portion 25 and an end portion of the interlayer stretchable wiring portion 35b are integrally fused with each other. This formation can significantly reduce a possibility of a disconnection at the connecting portions 39a and 39b. In this case, it is desirable that the stretchable wiring portions 15 and 25 and the interlayer stretchable wiring portions 35a and 35b are all formed through printing and application of an electroconductive paste containing a thermoplastic resin binder. With this formation, each of the wiring portions has a fusing property. Thus, the resin binder and electrically conductive particles are integrally fused with each other at each joining portion, which prevents occurrence of interface resistance at the joining portion.

However, the stretchable wiring portions 15 and 25, or the interlayer stretchable wiring portions 35a and 35b may be made out of a thermosetting resin binder. In this case, end portions of wiring portions can be connected with each other with the fusing property of the other wiring portion.

It should be noted that there is no particular limitation as to the shape of a series of wiring patterns formed by connecting the stretchable wiring portion 15, the stretchable wiring portion 25, and the interlayer stretchable wiring portions 35a and 35b. In this exemplary embodiment, the wiring pattern has a three-line shape as illustrated in FIG. 3.

The interlayer stretchable wiring portion 35a is connected with a terminal portion 41 at an end portion, located opposite to the connecting portion 39a, of the interlayer stretchable wiring portion 35a, and the interlayer stretchable wiring portion 35b is connected with an electrode portion 43 at an end portion, located opposite to the connecting portion 39b, of the interlayer stretchable wiring portion 35b. The interlayer stretchable wiring portion 35a is joined with and is connected directly with the terminal portion 41 in this exemplary embodiment. Instead of this, the interlayer stretchable wiring portion 35a may be indirectly connected with the terminal portion 41 through another electrically conductive portion. Similarly, the interlayer stretchable wiring portion 35b is joined with and is connected directly with the electrode portion 43 in this exemplary embodiment. Instead of this, the stretchable wiring portion 35b may be indirectly connected with the electrode portion 43 through another electrically conductive portion.

In addition, in this exemplary embodiment, the terminal portion 41 and the electrode portion 43 are formed on opposite sides to each other with respect to the interlayer stretchable base 30 in the thickness direction (layered direction). More specifically, the terminal portion 41 is formed on the main surface, located on the side of the stretchable base 10, of the interlayer stretchable base 30, and the electrode portion 43 is formed on the main surface, located on the side of the stretchable base 20, of the interlayer stretchable base 30. In addition, the terminal portion 41 and the electrode portion 43 are exposed to the outside of the stretchable circuit board 100 through the opening 12 and the opening 22 of the stretchable bases 10 and 20.

In the second exemplary embodiment, these configurations enable the terminal portion 41 and the electrode portion 43 to be provided on the opposite surfaces (both surfaces) of the stretchable circuit board 100.

The terminal portion 41 is a terminal provided to electrically connect the stretchable circuit board 100 with an external device (not illustrated). The terminal portion 41 may be connected with a terminal of an external device through an electrically conductive gel (not illustrated), or may be configured as a connector to which an external device is inserted or from which the external device is removed.

The terminal portion 41 may be formed only by an end portion of the interlayer stretchable wiring portion 35a, or may be configured as an electrically conductive coating appropriately formed and layered with this end portion. In the case where the terminal portion 41 includes an electrically conductive coating, the terminal portion 41 can be formed by layering an electrically conductive coating such as a carbon paste with an end portion, formed through printing, of the interlayer stretchable wiring portion 35a. In the case of the carbon paste, nonmetal carbon is used as electrically conductive particles, and hence, prevention of ion migration can be expected. On the contrary, in the case where the electrically conductive coating is not included, the terminal portion 41 may be obtained by forming the end portion of the interlayer stretchable wiring portion 35a into a specific shape using the electroconductive paste or carbon paste described above.

The electrode portion 43 is an electroconductive pattern. The electrode portion 43 according to this exemplary embodiment is formed on the lower surface of the interlayer stretchable base 30 and has a substantially square shape. In addition, the electrode portion 43 is used as a sensing electrode that measures, for example, biological potential through biological gel and the like. However, the number of and the shape of the electrode portion 43 are not limited to those illustrated in the drawings. In addition, each electrode portion 43 may be formed by multiple electrodes, and be used as a proximity sensor or a touch sensor.

The electrode portion 43 may have stretchability as with the interlayer stretchable wiring portion 35b, or it may be possible that the electrode portion 43 have in-plane rigidity higher than the interlayer stretchable wiring portion 35b, and substantially does not have stretchability. However, it is preferable that the electrode portion 43 is made from the same electrically conductive material as the interlayer stretchable wiring portion 35b, and is formed by printing using the processes equal to those used to form the interlayer stretchable wiring portion 35b. With this configuration, the electrode portion 43 also has an excellent stretching property, and the stretchable circuit board 100 can be obtained through the minimized number of processes.

[Manufacturing Method]

Next, a method (hereinafter, also referred to as the present method) for manufacturing the stretchable circuit board 100 according to the second exemplary embodiment will be described with reference to FIG. 5.

The method for manufacturing the stretchable circuit board 100 at least includes: a step (first wiring forming step) of forming the stretchable wiring portion 15 or 25 on a main surface of at least one side of each of the plural stretchable bases 10 and 20; a step (second wiring forming step) of forming the interlayer stretchable wiring portion 35a or 35b on each main surface of both sides of the interlayer stretchable base 30; a step (placing step) of placing the stretchable bases 10 and 20 and the interlayer stretchable base 30 at predetermined positions; and a step (electrical connection step) of heating or applying pressure to the stretchable bases 10 and 20 to cause the stretchable wiring portions 15 and 25 to be electrically continuous with each other through the connecting portion 34 in the opening 32 of the interlayer stretchable base 30, to cause the stretchable wiring portion 15 and the interlayer stretchable wiring portion 35a to be electrically continuous with each other, and to cause the stretchable wiring portion 25 and the interlayer stretchable wiring portion 35b to be electrically continuous with each other. The order of these steps being performed before or after may be freely determined.

Next, the present method will be described in detail.

The first wiring forming step has already been described in the first exemplary embodiment as the wiring forming step.

In the second wiring forming step, the interlayer stretchable base 30 is prepared, and an electroconductive paste is applied to a main surface of at least one side of the interlayer stretchable base 30 through a printing method to form the interlayer stretchable wiring portion 35a or 35b. In this exemplary embodiment, the interlayer stretchable wiring portion 35a is formed on the upper surface of the interlayer stretchable base 30, and the interlayer stretchable wiring portion 35b is formed on the lower surface of the interlayer stretchable base 30.

In the placing step, in addition to the positional relationship employed in the first exemplary embodiment, positional relationships between end portions of a stretchable wiring portion and the interlayer stretchable wiring portion, which are to be connected with each other, are also employed when the stretchable bases 10 and 20 and the interlayer stretchable base 30 are positioned. More specifically, positioning is performed at positions where the stretchable wiring portions 15 and 25 face each other with the opening 32 of the interlayer stretchable base 30 being disposed therebetween; part of the stretchable wiring portion 15 and part of the interlayer stretchable wiring portion 35a face each other; and part of the stretchable wiring portion 25 and part of the interlayer stretchable wiring portion 35b face each other.

In the electrical connection step, an end portion of a stretchable wiring portion and an end portion of the interlayer stretchable wiring portion are joined directly with each other, in addition to the electrical continuity between the stretchable wiring portions 15 and 25 through the connecting portion 34 according to the first exemplary embodiment. More specifically, heat or pressure is applied to the stretchable bases 10 and 20 to join part of the stretchable wiring portion 15 and part of the interlayer stretchable wiring portion 35a in the thickness direction to integrally fuse them, and join part of the stretchable wiring portion 25 and part of the interlayer stretchable wiring portion 35b in the thickness direction to integrally fuse them. In addition, at this time, the opposite surfaces of the stretchable base 10 and the interlayer stretchable base 30 are joined directly with each other, and the opposite surfaces of the stretchable base 20 and the interlayer stretchable base 30 are joined directly with each other. Through these processes, the stretchable bases 10 and 20 and the interlayer stretchable base 30 are fused and joined. The heating method and the pressure applying method have been already described in the first exemplary embodiment.

According to the present method, it is possible to electrically and mechanically connect the stretchable wiring portions 15 and 25 directly with the interlayer stretchable wiring portions 35a and 35b, to electrically and mechanically connect the stretchable wiring portion 15 with the stretchable wiring portion 25 through the opening 32 of the interlayer stretchable base 30, and to mechanically join the stretchable bases 10 and 20 and the interlayer stretchable base 30, without using any adhesive or pressure-sensitive adhesive. As a result, it is possible to achieve the electrical connection step including joining, through a significantly simplified step.

It should be noted that, in the case where the terminal portion 41 includes an electrically conductive coating, it may be possible to add a step of layering the electrically conductive coating on an end portion of the interlayer stretchable wiring portion 35a, for example, through printing of a carbon paste, as a step of forming the terminal portion 41.

[Modification of Second Exemplary Embodiment]

In the second exemplary embodiment described above, the terminal portion 41 and the electrode portion 43 are provided on surfaces opposite to each other (both surfaces) of the stretchable circuit board 100. This can be achieved by the configuration described below as an example. Below, a stretchable circuit board 100 according to a modification (hereinafter, referred to as this modification) of the second exemplary embodiment will be described with focus being placed on details different from those in the second exemplary embodiment.

Figure 6:
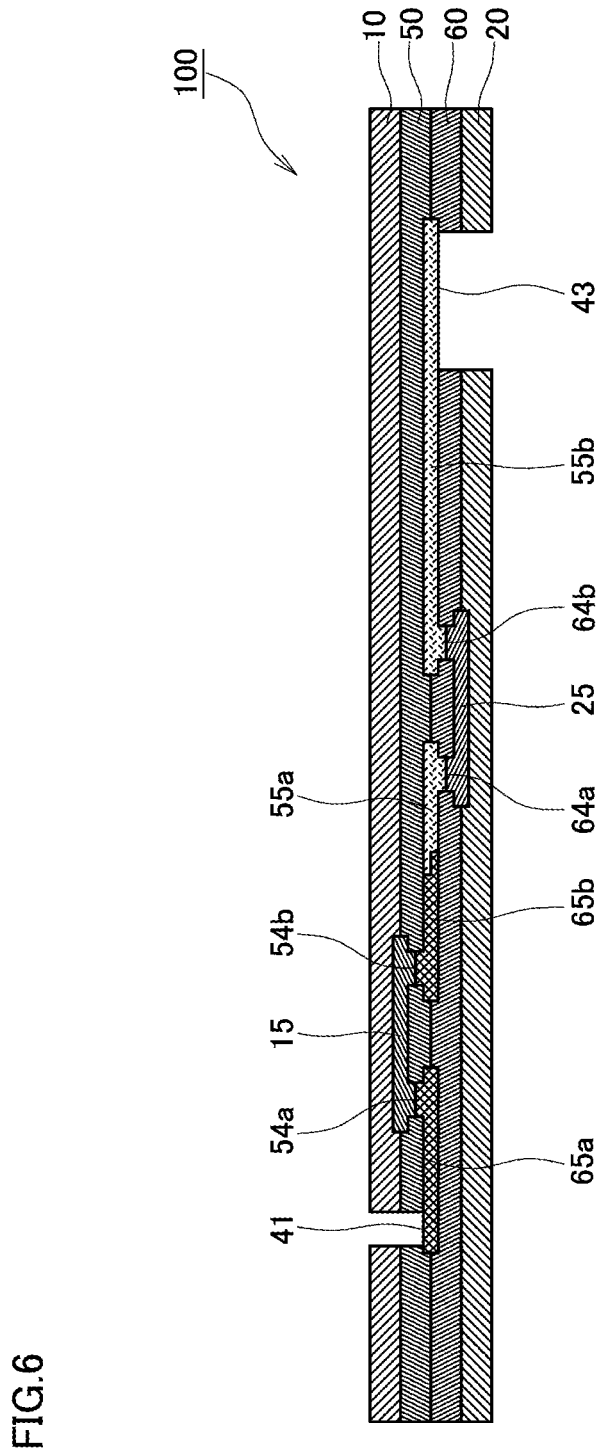
FIG. 6 is a sectional view illustrating a stretchable circuit board according to a modification of the second exemplary embodiment.
Figure 7:
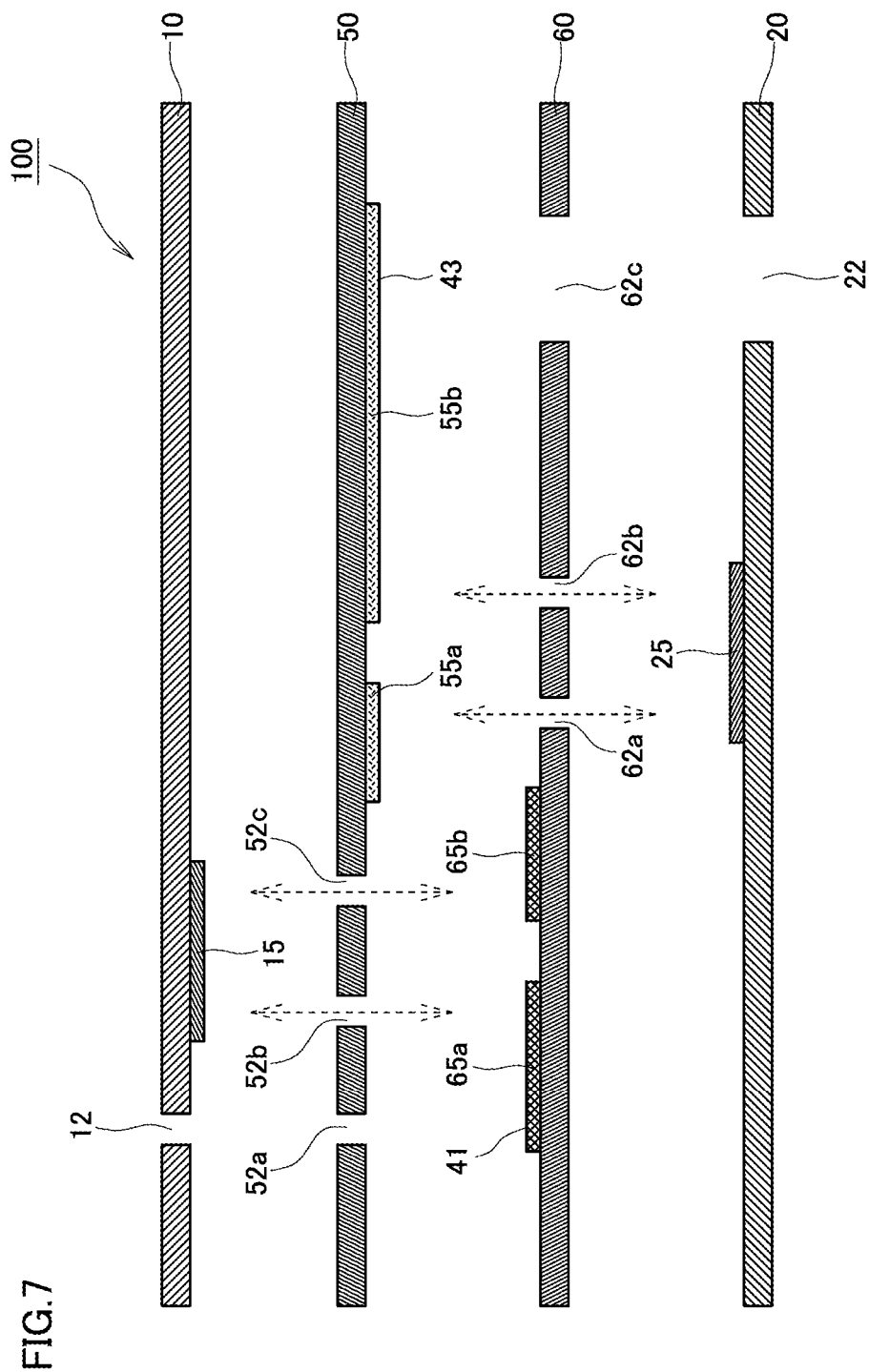
FIG. 7 is an exploded schematic view of FIG. 6.

FIG. 6 is a sectional view illustrating a stretchable circuit board 100 according to the modification of the second exemplary embodiment. FIG. 7 is an exploded schematic view of FIG. 6. For the purpose of convenience, the bottom side in FIG. 6 and FIG. 7 may be called the lower surface side, and the upper side in FIG. 6 and FIG. 7 may be called the upper surface side. These directions, however, are defined for the purpose of convenience with the aim of illustrating relative positional relationships of constituent elements, and do not necessarily match the top or bottom in the gravity direction.

The stretchable circuit board 100 according to this modification includes stretchable bases 10 and 20, and interlayer stretchable bases 50 and 60, and has a multi-layer structure in which these bases are layered. As in the second exemplary embodiment, the stretchable bases 10 and 20 have stretchable wiring portions 15 and 25 formed thereon.

Unlike the exemplary embodiments described above, in this modification, two interlayer stretchable bases 50 and 60 lie between the stretchable base 10 and the stretchable base 20. In addition, interlayer stretchable wiring portions 55a and 55b or interlayer stretchable wiring portions 65a and 65b are formed on a main surface of only one side of each of the interlayer stretchable bases 50 and 60.

In addition, the stretchable wiring portions 15 and 25 formed on the stretchable bases 10 and 20 are not connected directly with each other through an opening of an interlayer stretchable base, and are electrically continuous with each other through interlayer stretchable wiring portions formed on the interlayer stretchable bases 50 and 60. More specifically, the stretchable wiring portion 15 is electrically continuous with the interlayer stretchable wiring portion 65a through a connecting portion 54a in an opening 52b of the interlayer stretchable base 50, and is electrically continuous with the interlayer stretchable wiring portion 65b through a connecting portion 54b in an opening 52c of the interlayer stretchable base 50. In addition, the stretchable wiring portion 25 is electrically continuous with the interlayer stretchable wiring portion 55a through a connecting portion 64a in an opening 62a of the interlayer stretchable base 60, and is electrically continuous with the interlayer stretchable wiring portion 55b through a connecting portion 64b in an opening 62b of the interlayer stretchable base 60. Moreover, part of the interlayer stretchable wiring portion 55a of the interlayer stretchable base 50 and part of the interlayer stretchable wiring portion 65b of the interlayer stretchable base 60 are joined directly with each other, and are electrically continuous with each other.

In other words, in this modification, the stretchable wiring portions 15 and 25 provided on respective main surfaces of stretchable bases 10 and 20 are electrically continuous with each other through connecting portions (54b, 64a) in openings (52c, 62a) of the interlayer stretchable bases (50 and 60).

It is desirable to form the connecting portions 54a, 54b, 64a, and 64b in respective openings by integrally fusing parts of individual wiring portions with each other. These connecting portions are portions similar to the connecting portions 34a, 34b, and 34c according to the first exemplary embodiment, and the connecting portion 34 according to the second exemplary embodiment.

In addition, in this modification, the terminal portion 41 is connected with the interlayer stretchable wiring portion 65a formed on the interlayer stretchable base 60, and the electrode portion 43 is connected with the interlayer stretchable wiring portion 55b formed on the interlayer stretchable base 50. The terminal portion 41 is configured so as to be able to be exposed in the direction of the upper surface through the opening 52a of the interlayer stretchable base 50 and the opening 12 of the stretchable base 10. The electrode portion 43 is configured so as to be able to be exposed in the direction of the lower surface through the opening 62c of the interlayer stretchable base 60 and the opening 22 of the stretchable base 20.

The stretchable circuit board 100 according to this modification can be manufactured through a first wiring forming step, a second wiring forming step, a placing step, and an electrical connection step. This first wiring forming step is a step similar to that in the second exemplary embodiment.

In the second wiring forming step, an electroconductive paste is applied to the lower surface of the interlayer stretchable base 50 through a printing method to form the interlayer stretchable wiring portions 55a and 55b, and an electroconductive paste is applied to the upper surface of the interlayer stretchable base 60 to form the interlayer stretchable wiring portions 65a and 65b. In this modification, in order to enhance handleability of the interlayer stretchable bases 50 and 60 each having stretchability, this second wiring forming step may be performed in a state where the upper surface of the interlayer stretchable base 50 and the lower surface of the interlayer stretchable base 60 are coated with a separator (not illustrated) made out of, for example, a paper material.

According to this modification, in the second wiring forming step, it is possible to form the interlayer stretchable wiring portions 55a and 55b and the interlayer stretchable wiring portions 65a and 65b through single-sided printing, whereby it is possible to achieve high-speed manufacturing and simplified manufacturing steps.

In the placing step, positioning is performed at positions where part of the stretchable wiring portion 15 and part of the interlayer stretchable wiring portion 65a face each other with the opening 52b being disposed therebetween; part of the stretchable wiring portion 15 and part of the interlayer stretchable wiring portion 65b face each other with the opening 52c being disposed therebetween; part of the interlayer stretchable wiring portion 55a and part of the interlayer stretchable wiring portion 65b directly face each other; part of the interlayer stretchable wiring portion 55a and part of the stretchable wiring portion 25 face each other with the opening 62a being disposed therebetween; and part of the stretchable wiring portion 25 and part of the interlayer stretchable wiring portion 55b face each other with the opening 62b being disposed therebetween.

In the electrical connection step, heat or pressure is applied to the stretchable bases 10 and 20, whereby electrical continuity between the stretchable wiring portion 15 and the interlayer stretchable wiring portions 65a and 65b and electrical continuity between the stretchable wiring portion 25 and the interlayer stretchable wiring portions 55a and 55b are established through the connecting portions 54a, 54b, 64a, and 64b. In addition, part of the interlayer stretchable wiring portion 55a and part of the interlayer stretchable wiring portion 65b are connected with each other in the thickness direction, and the interlayer stretchable wiring portions 55a and 65b are made electrically continuous with each other. In other words, the interlayer stretchable wiring portion 65a connected with the terminal portion 41 and the interlayer stretchable wiring portion 55b connected with the electrode portion 43 are made electrically continuous with each other through the stretchable wiring portion 15, the interlayer stretchable wiring portion 65b, the interlayer stretchable wiring portion 55a, and the stretchable wiring portion 25.

In this modification, two layers made out of the interlayer stretchable bases 50 and 60 are provided. However, three or more layers of interlayer stretchable bases may be provided.

Various constituent elements of the stretchable circuit board 100 and so on according to the present invention need not exist as separate elements. It may be possible to employ, for example, a configuration in which plural constituent elements are formed as one member, a configuration in which one constituent element is formed by plural members, a configuration in which one constituent element forms a part of another constituent element, and a configuration in which a part of one constituent element overlaps with a part of another constituent element.

Third Exemplary Embodiment

Below, a stretchable circuit board 200 according to a third exemplary embodiment will be described with reference to FIG. 8 to FIG. 12. Note that, in the third exemplary embodiment, description will be made with focus being placed on details specific to the third exemplary embodiment, and details that are the same as those in the first exemplary embodiment and the second exemplary embodiment will not be repeated as appropriate.

Figure 8:
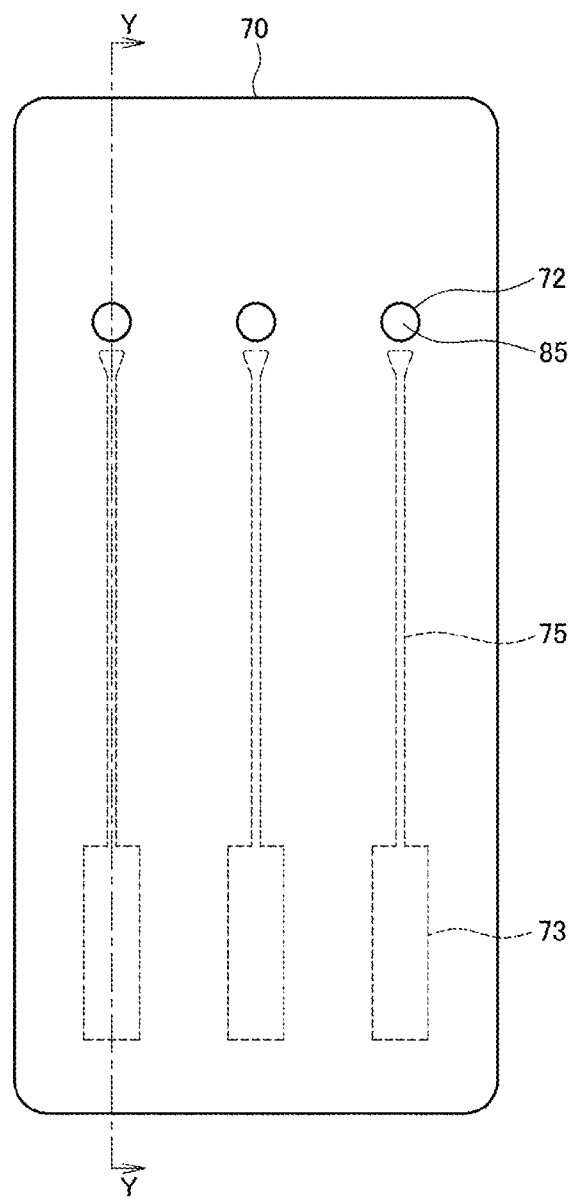
FIG. 8 is a top view illustrating a stretchable board according to a third exemplary embodiment.
Figure 9:
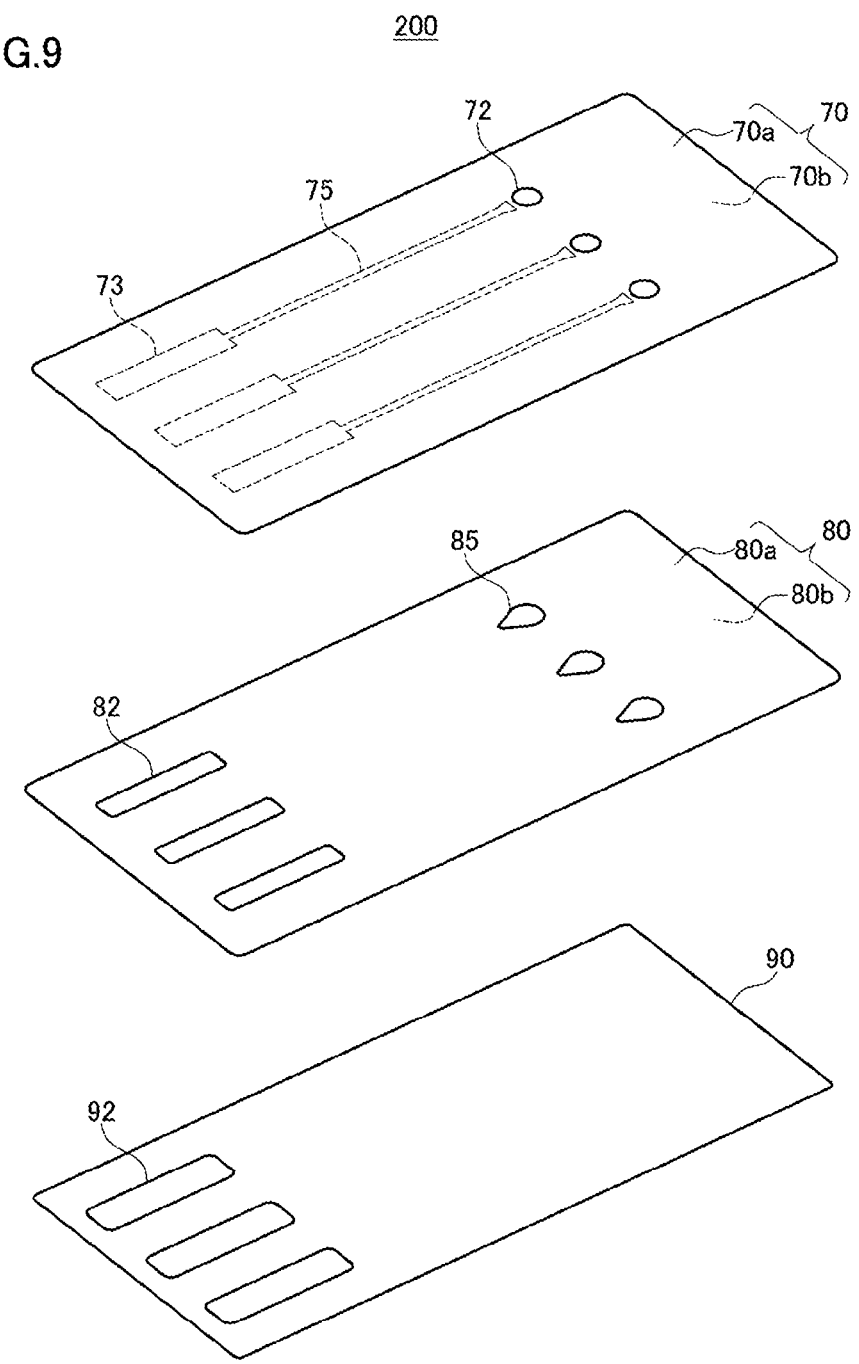
FIG. 9 is an exploded perspective view illustrating a stretchable circuit board illustrated in FIG. 8.
Figure 10:
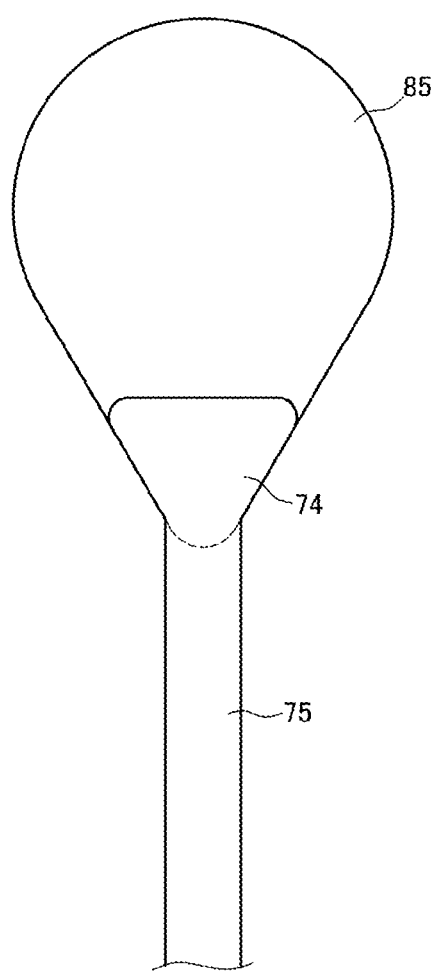
FIG. 10 is a diagram illustrating a connecting portion between a terminal portion and a stretchable wiring portion illustrated in FIG. 8.
Figure 11:
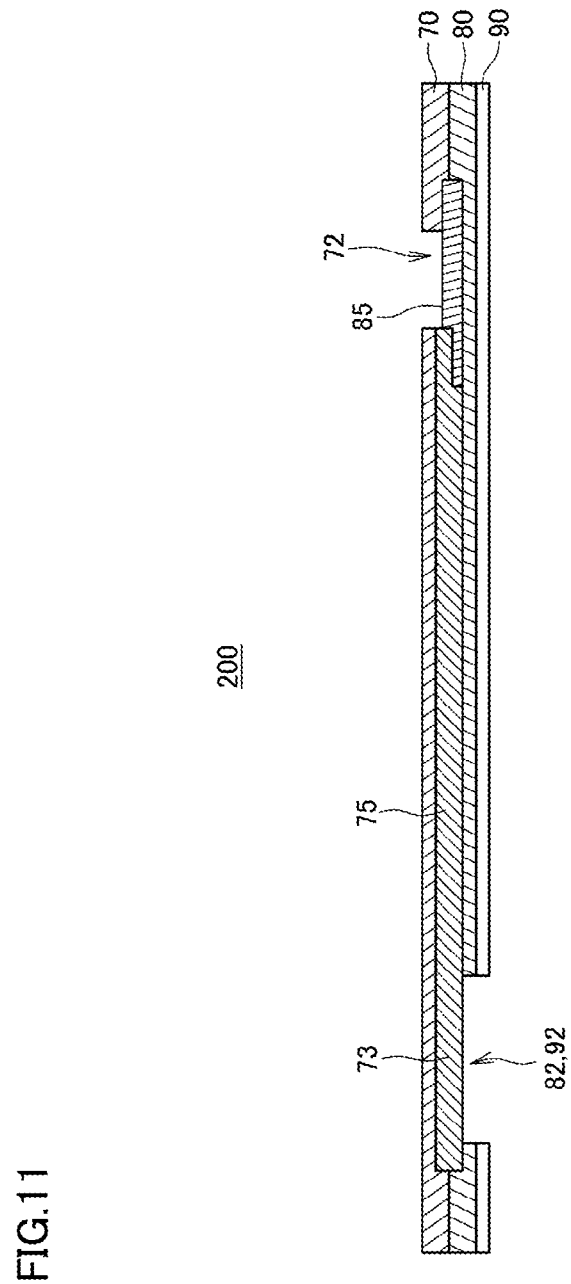
FIG. 11 is a sectional view illustrating the stretchable board illustrated in FIG. 8.
Figure 12:
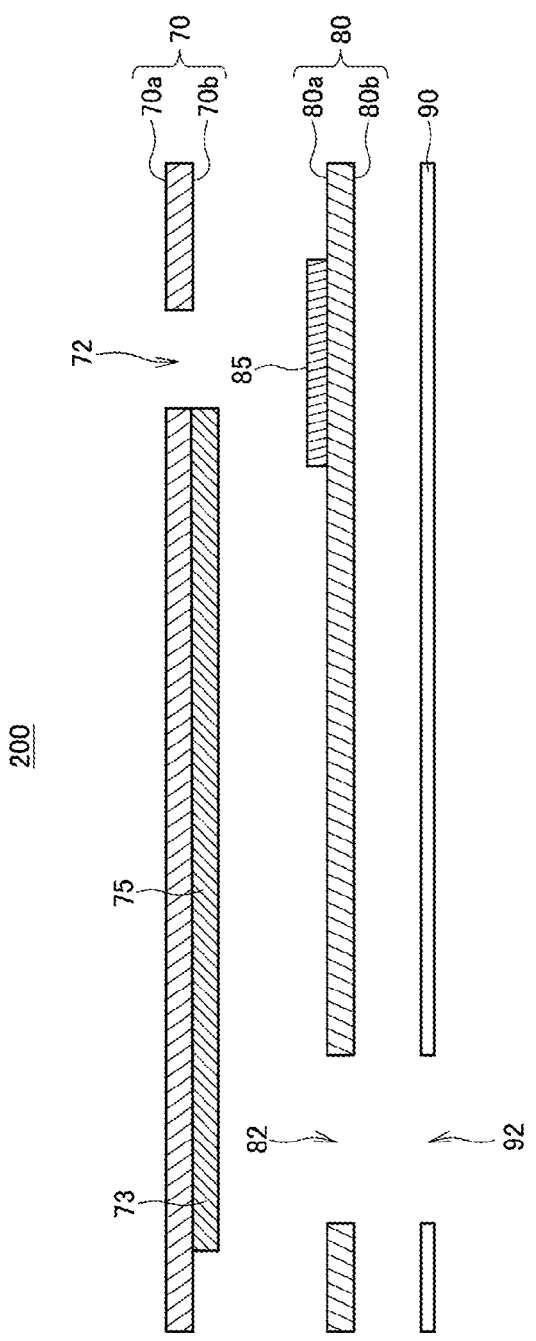
FIG. 12 is an exploded schematic view illustrating a stretchable circuit board according to the third exemplary embodiment.

FIG. 8 is a plan view illustrating the stretchable circuit board 200 according to the third exemplary embodiment when viewed from the side of the upper surface (from the upper direction in FIG. 8). FIG. 9 is an exploded perspective view illustrating the stretchable circuit board 200 illustrated in FIG. 8. FIG. 10 is a diagram for explaining a connecting portion 74 between a terminal portion 85 serving as a stretchable external terminal and a stretchable wiring portion 75 illustrated in FIG. 9. FIG. 11 is a sectional view taken along the line Y-Y of the stretchable circuit board 200 illustrated in FIG. 8. FIG. 12 is an exploded schematic view of FIG. 11. For the purpose of convenience, the side away from a reader who is looking at FIG. 8 and the bottom side in FIG. 11 and FIG. 12 may be called the lower surface side, and the side toward the reader who is looking at FIG. 8 and the upper side in FIG. 11 and FIG. 12 may be called the upper surface side. These directions, however, are defined for the purpose of convenience with the aim of illustrating relative positional relationships of constituent elements, and do not necessarily match the top or bottom in the gravity direction.

As in the second exemplary embodiment, the stretchable circuit board 200 according to the third exemplary embodiment may not only be used as a stretchable circuit board having a living-body attached type but also be used by attaching it, for example, to a robot, various types of devices, units, or wearable items.

As illustrated in FIG. 8 and FIG. 9, the stretchable circuit board 200 includes plural stretchable bases, as in the first exemplary embodiment and the second exemplary embodiment. In the third exemplary embodiment, the plural stretchable bases are set to two stretchable bases: a stretchable base 70 and a stretchable base 80.

As with the stretchable bases 10 and 20 in the first exemplary embodiment, the stretchable bases 70 and 80 are sheet-shaped members that can stretch at least one direction of in-plane directions, and desirably, that can stretch in two directions of in-plane directions. The stretchable bases 70 and 80 may have isotropic stretchability in in-plane directions, or may have anisotropic stretchability in in-plane directions so that they stretch differently in different directions in plane.

Each of the stretchable bases 70 and 80 is made from an electrically insulating material. A preferable base material of the stretchable bases 70 and 80 includes an elastomer material such as nitrile rubber, latex rubber, urethane-based elastomer, and silicone-based elastomer. However, the base material is not limited to these materials. The stretchable bases 70 and 80 may be made from the same material, or may be made from different materials. In the case where all of the stretchable bases 70 and 80 are made from a base material having a fusing property, it is possible to firmly join the stretchable bases 70 and 80 with each other through heating and application of pressure to the stretchable bases 70 and 80 without using any adhesive or pressure-sensitive adhesive.

Although there is no limitation as to the thickness of the stretchable bases 70 and 80, it is preferable to set the thickness of these bases, for example, to not more than 100 μm from the viewpoint of not blocking stretching movements of the target (target surface) (for example, the surface of a living body) to which the stretchable circuit board 200 is applied. The thickness of each of the stretchable bases is set more desirably to not more than 25 μm, still more desirably to not more than 10 μm. These stretchable bases 70 and 80 may have the same thickness, or may have different thicknesses.

As illustrated in FIG. 9, the stretchable base 70 has a main surface 70a on the upper surface side and a main surface 70b on the lower surface side. The stretchable base 80 has a main surface 80a on the upper surface side and a main surface 80b on the lower surface side. On the stretchable circuit board 200, the main surface 70b (first main surface) and the main surface 80a (second main surface) are arranged so as to face each other. The stretchable base 70 includes an opening 72, and also includes a stretchable electrode portion 73 and a stretchable wiring portion 75, each of which serves as a first stretchable wiring portion formed on the main surface 70b. Of these elements, the stretchable wiring portion 75 corresponds to the line portion and the electrode portion 73 corresponds to the pattern portion in the third exemplary embodiment. In addition, the stretchable base 80 includes an opening 82 and a stretchable terminal portion 85 serving as a second stretchable wiring portion formed on the main surface 80a. Of these elements, the terminal portion 85 corresponds to the pattern portion in the third exemplary embodiment. With the third exemplary embodiment, the width of the pattern portion is set so that the pattern portion has a portion wider than the width of the line portion. This makes it easy to position the line portion and the pattern portion, and also this makes the size of the contacting portion increased, achieving a reduction in electric resistance.

Furthermore, unlike the first exemplary embodiment and the second exemplary embodiment, the stretchable bases 70 and 80 are configured such that: the main surface 70b and the main surface 80a face each other; the opening 72 and at least part of the stretchable terminal portion 85 overlap with each other; and the opening 82 and at least part of the electrode portion 73 overlap with each other.

Overlapping of the opening 72 with the terminal portion 85 and overlapping of the opening 82 with the electrode portion 73 are achieved by overlapping the stretchable bases 70 and 80 with each other. Application of heat or pressure to each of the bases enables the stretchable bases 70 and 80 to be overlapped with each other. By applying heat or pressure to the stretchable bases 70 and 80, the stretchable base 70 and the stretchable base 80 are fused with each other. The method of heating may include a laminate method using a heating roll, and a method using heating and pressing.

In the third exemplary embodiment, with the configuration described above, the terminal portion 85 is exposed from the opening 72 on the upper surface side of the stretchable circuit board 200, and the electrode portion 73 is exposed from the opening 82 of the lower surface side. In addition, the stretchable wiring portion 75 is joined with the terminal portion 85. This joining of the stretchable wiring portion 75 with the terminal portion 85 is performed by overlapping the stretchable wiring portion 75 with part of the terminal portion 85 as illustrated in FIG. 10. In FIG. 10, the overlapping portion between the stretchable wiring portion 75 and the terminal portion 85 is indicated as the connecting portion 74. In addition, in the third exemplary embodiment, the electrode portion 73 and the stretchable wiring portion 75 are integrally formed, and hence, the electrode portion 73, the stretchable wiring portion 75, and the terminal portion 85 are electrically and mechanically connected in the stretchable circuit board 200. Furthermore, the electrode portion 73 or the terminal portion 85 through which electrical signals can be input or output is formed on both of the lower surface side and the upper surface side of the stretchable circuit board 200.

The terminal portion 85 is a terminal provided to electrically connect with an external device (not illustrated). The terminal portion 85 may be connected with a terminal of the external device (not illustrated) through an electrically conductive gel (not illustrated), or the shape of the terminal portion 85 may be changed from a terminal shape into a connector terminal shape to configure it as a connector into which an external device is inserted or from which the external device is removed. The terminal portion 85 may be configured as a single layer of electrically conductive layer, or may be configured with an electrically conductive coating that is formed appropriately in a manner layered with the end portion.

The electrode portion 73 is an electroconductive pattern. The electrode portion 73 according to the third exemplary embodiment is formed into a substantially square shape on the main surface 70b of the stretchable base 70, and is used as a sensor electrode for measuring electrical signals, for example, through a biological gel. However, the number of or the shape of the electrode portion 73 is not limited to those illustrated in the drawings.

The electrode portion 73, the stretchable wiring portion 75, and the terminal portion 85 are stretchable electroconductive patterns that are pattern formed on the main surfaces 70b and 80a of the stretchable bases 70 and 80. As for the electrically conductive material contained in each of the electroconductive patterns, it may be possible to select a material having preferable electrical conductivity such as silver, gold, platinum, carbon, copper, aluminum, cobalt, and nickel, or an alloy thereof. As for the electrically conductive materials of the electrode portion 73, the stretchable wiring portion 75, and the terminal portion 85, it may be possible to employ electrically conductive materials similar to those of the stretchable wiring portions 15 and 25 in the first exemplary embodiment. It is preferable that, in addition to those electrically conductive materials, the electrode portion 73, the stretchable wiring portion 75, and the terminal portion 85 further include a resin binder. With the resin binder being included, it is possible to prevent the electrode portion 73, the stretchable wiring portion 75, and the terminal portion 85 from breaking as a result of stretching of the stretchable circuit board 200. As for the resin binder, it may be possible to employ a resin binder similar to that of the stretchable wiring portions 15 and 25 in the first exemplary embodiment.

Although there is no particular limitation as to a method for forming the electrode portion 73, the stretchable wiring portion 75, and the terminal portion 85, it may be possible to form them, for example, through a printing method. In other words, the electrode portion 73, the stretchable wiring portion 75, and the terminal portion 85 are printed patterns that are formed by printing and applying a stretchable electroconductive paste onto the stretchable base 70 or 80. In the third exemplary embodiment, at this time, the electrode portion 73 and the stretchable wiring portion 75 can be formed as an integrated pattern.

Although there is no particular limitation as to a specific printing method for forming the printed patterns, the printing method may include, for example, a screen printing method, an inkjet printing method, a gravure printing method, and an offset printing method. The stretchability of each of the electrode portion 73, the stretchable wiring portion 75, and the terminal portion 85 may be achieved by the above-described materials of the electrode portion 73, the stretchable wiring portion 75, and the terminal portion 85 themselves, or may be achieved by a structure such as a meandering shape, or may be achieved by the combination thereof.

The thickness size and the width size of each of the electrode portion 73, the stretchable wiring portion 75, and the terminal portion 85 can be determined on the basis of resistivity of each of the electrode portion 73, the stretchable wiring portion 75, and the terminal portion 85 at no load, a change in resistance of each of the stretchable bases 70 and 80 when it stretches, and restriction on the thickness size and the width size of the entire stretchable circuit board 200. The width size of each of the electrode portion 73, the stretchable wiring portion 75, and the terminal portion 85 is set preferably to not more than 1000 μm, more preferably to not more than 500 μm, still more preferably to not more than 200 μm so that the electrode portion 73, the stretchable wiring portion 75, and the terminal portion 85 can follow a change in a size thereof at the time of stretching, thereby achieving favorable stretchability. The thickness size of each wire constituting the electrode portions 73, the stretchable wiring portion 75, and the terminal portion 85 may be set to not more than 25 μm, and be set desirably to be not less than 10 μm and not more than 15 μm.

Furthermore, on the stretchable circuit board 200, a sticking-agent layer 90 for attaching the stretchable circuit board 200, for example, to a living body or a robot is formed on the main surface 80b of the stretchable base 80. For the sticking-agent layer 90, a layer of hydrogel or pressure-sensitive adhesive is used. In addition, the sticking-agent layer 90 is not formed on an area overlapping with the opening 82, and hence, an opening 92 that matches the opening 82 is formed on the sticking-agent layer 90. In order to electrically connect, for example, the electrode portion 73 with the living body in this state, it is only necessary to apply a gel containing an electrolyte or sodium-based conductive cream (not illustrated) on the inner side of the opening 92 of the sticking-agent layer 90, and affix it on a living body.

[Manufacturing Method]

Next, a method for manufacturing the stretchable circuit board 200 according to the third exemplary embodiment will be described with reference to FIG. 12. As illustrated in FIG. 12, in connection with the method for manufacturing the stretchable circuit board 200, the stretchable base 70 includes the opening 72, the stretchable wiring portion 75 formed on the main surface 70b, and the electrode portion 73, and the stretchable base 80 includes the opening 82 and the terminal portion 85 formed on the main surface 80a. In addition, in a step of making these wiring portions (the stretchable wiring portion, the terminal portion, and the electrode portion) electrically continuous with each other, the main surface 70b and the main surface 80a are placed so as to face each other. At this time, in the third exemplary embodiment, the stretchable bases 70 and 80 are disposed so that the opening 72 and at least part of the terminal portion 85 overlap with each other, and the opening 82 and at least part of the electrode portion 73 overlap with each other, and heat or pressure is applied to the stretchable base 70 and the stretchable base 80.

Furthermore, in the third exemplary embodiment, the sticking-agent layer 90 is formed on the main surface 80a of the stretchable base 80 to complete the stretchable circuit board 200.

Through these steps, by applying heat or pressure to the stretchable bases 70 and 80, they enter the vicinity of the wiring portions such as the stretchable wiring portion 75, and the electrical insulation property of the wiring portions can be sufficiently achieved. Unlike the first exemplary embodiment and the second exemplary embodiment, the stretchable circuit board 200 according to the third exemplary embodiment does not need the interlayer stretchable base. Thus, the number of parts is low, and hence, the stretchable circuit board 200 according to the third exemplary embodiment provides an effect of simplifying the manufacturing processes.

The exemplary embodiments described above include the following technical ideas.

(1) A stretchable circuit board including:
plural stretchable bases; and
plural stretchable wiring portions, at least one of which is provided on each of main surfaces, facing each other, of the plural stretchable bases, in which
the stretchable wiring portions provided on the respective main surfaces are electrically continuous with each other through a connecting portion.

(2) The stretchable circuit board according to (1), in which
the connecting portion is formed by integrally fusing, with each other, parts of the stretchable wiring portions provided on the respective main surfaces.

(3) The stretchable circuit board according to (1) or (2), further including:
an interlayer stretchable base that lies between the main surfaces and has an opening, in which
the stretchable wiring portions provided on the respective main surfaces are electrically continuous with each other through the connecting portion in the opening of the interlayer stretchable base.

(4) The stretchable circuit board according to (3), in which
the interlayer stretchable base has moisture permeability lower than moisture permeability of any of the plural stretchable bases.

(5) The stretchable circuit board according to (3) or (4), in which
the moisture permeability of the interlayer stretchable base is not more than 500 g/m$^2$·24 hr.

(6) The stretchable circuit board according to any one of (3) to (5), further including:

an interlayer stretchable wiring portion provided on one main surface of the interlayer stretchable base, in which the main surface, having the stretchable wiring portion formed thereon, of one of the plural stretchable bases directly or indirectly faces and is layered on the one main surface of the interlayer stretchable base, and part of the stretchable wiring portion and part of the interlayer stretchable wiring portion are connected with each other in a thickness direction, and are electrically continuous with each other.

(7) The stretchable circuit board according to (6), in which the interlayer stretchable wiring portion is connected with an electrode portion or a terminal portion.

(8) The stretchable circuit board according to (7), in which the electrode portion and the terminal portion are formed on opposite sides of the interlayer stretchable wiring portion in a thickness direction.

(9) The stretchable circuit board according to (1) or (2), in which the plural stretchable bases include a first stretchable base and a second stretchable base, the first stretchable base includes a first opening portion and a first stretchable wiring portion formed on a first main surface of the first stretchable base, the second stretchable base includes a second opening portion and a second stretchable wiring portion formed on a second main surface of the second stretchable base, the first main surface and the second main surface face each other, the first opening portion and at least part of the second stretchable wiring portion overlap with each other, and the second opening portion and at least part of the first stretchable wiring portion overlap with each other.

(10) The stretchable circuit board according to (9), in which at least either one of the first stretchable wiring portion and the second stretchable wiring portion includes a line portion having a line shape and having a constant width, the first stretchable wiring portion and the second stretchable wiring portion include a pattern portion including a portion of which length in a width direction of the line portion is longer than the line portion, the first opening portion overlaps with at least part of the pattern portion of the second stretchable wiring portion, and the second opening portion overlaps with at least part of the pattern portion of the first stretchable wiring portion.

(11) A method for manufacturing a stretchable circuit board, including a step of forming a stretchable wiring portion on a main surface of at least one side of each of plural stretchable bases; and an electrical connection step in which heat or pressure is applied to the plural stretchable bases to cause the stretchable wiring portions to be electrically continuous with each other.

(12) The method for manufacturing a stretchable circuit board according to (11), further including:

a step of placing the plural stretchable bases and an interlayer stretchable base at positions where the formed stretchable wiring portions face each other with an opening of the interlayer stretchable base being disposed between the formed stretchable wiring portions, in which in the electrical connection step, each of the stretchable wiring portions is connected through a connecting portion in the opening of the interlayer stretchable base.

(13) The method for manufacturing a stretchable circuit board according to (12) further including:

a step of forming an interlayer stretchable wiring portion on a main surface of at least one side of the interlayer stretchable base, in which the placing step includes placing the interlayer stretchable base and the stretchable base at positions where part of a stretchable wiring portion formed on the stretchable base and part of the interlayer stretchable wiring portion face each other, and the electrical connection step includes joining part of the stretchable wiring portion and part of the interlayer stretchable wiring portion in a thickness direction to form the connecting portion, and cause the stretchable wiring portion and the interlayer stretchable wiring portion to be electrically continuous with each other.

(14) The method for manufacturing a stretchable circuit board according to (11), in which the plural stretchable bases include a first stretchable base and a second stretchable base, the first stretchable base includes a first opening portion and a first stretchable wiring portion formed on a first main surface, the second stretchable base includes a second opening portion and a second stretchable wiring portion formed on a second main surface, in the electrical connection step, heat or pressure is applied to the first stretchable base and the second stretchable base so that the first main surface and the second main surface face each other, the first opening portion and at least part of the second stretchable wiring portion overlap with each other, and the second opening portion and at least part of the first stretchable wiring portion overlap with each other.

What is claimed is:

1. A stretchable circuit board, comprising:
    a plurality of stretchable bases comprising:
        a first stretchable base having a first main surface and a second main surface opposite to the first main surface, the first stretchable base having a first through opening, and
        a second stretchable base having a third main surface and a fourth main surface opposite to the third main surface, the second stretchable base having a second through opening, the first stretchable base being joined with the second stretchable base such that the second main surface is opposed to the third main surface; and
    a plurality of stretchable wiring portions comprising:
        a first stretchable wiring portion, and
        a second stretchable wiring portion,
    wherein an entire of the first stretchable wiring portion and an entire of the second stretchable wiring portion are extended between the second main surface and the third main surface,
    wherein the first stretchable wiring portion and the second stretchable wiring portion are integrally fused to each other and electrically connected therebetween,
    wherein the first stretchable wiring portion is formed on the second main surface of the first stretchable base,
    wherein the second stretchable wiring portion is formed on the third main surface of the second stretchable base,
    wherein the first stretchable wiring portion and the second main surface overlap with the second through opening such that the first stretchable wiring portion is exposed through the second through opening in a direction toward the fourth main surface, wherein the second stretchable wiring portion and the third main surface overlap with the first through opening such that the second stretchable wiring portion is exposed through the first through opening in a direction toward the first main surface.

2. The stretchable circuit board according to claim 1, further including:
   an interlayer stretchable base that lies between the main surfaces and has an opening, wherein
   the stretchable wiring portions provided on the respective main surfaces are electrically continuous with each other through the connecting portion in the opening of the interlayer stretchable base.

3. The stretchable circuit board according to claim 2, wherein
   the interlayer stretchable base has moisture permeability lower than that of any of the plurality of stretchable bases.

4. The stretchable circuit board according to claim 2, wherein
   the moisture permeability of the interlayer stretchable base is not more than 500 g/m$^2$·24 hr.

5. The stretchable circuit board according to claim 2, further comprising:
   an interlayer stretchable wiring portion provided on one main surface of the interlayer stretchable base, wherein
   a main surface, having a stretchable wiring portion formed thereon, of one of the plurality of stretchable bases directly or indirectly faces and is layered on the one main surface of the interlayer stretchable base, and
   part of the stretchable wiring portion and part of the interlayer stretchable wiring portion are connected with each other in a thickness direction, and are electrically continuous with each other.

6. The stretchable circuit board according to claim 5, wherein
   the interlayer stretchable wiring portion is connected with an electrode portion or a terminal portion.

7. The stretchable circuit board according to claim 6, wherein
   the electrode portion and the terminal portion are formed on opposite sides of the interlayer stretchable wiring portion in a thickness direction.

8. The stretchable circuit board according to claim 1, wherein
   the first stretchable wiring portion includes a line portion having a line shape and having a constant width,
   the second stretchable wiring portion includes a terminal portion to connect with an external device, the terminal portion including a portion wider than the constant width of the line portion,
   the terminal portion is exposed through the first through opening.

* * * * *